(12) United States Patent
Gulati et al.

(10) Patent No.: US 9,188,642 B2
(45) Date of Patent: Nov. 17, 2015

(54) RECONFIGURABLE MEMORY INTERFACE CIRCUIT TO SUPPORT A BUILT-IN MEMORY SCAN CHAIN

(71) Applicant: QUALCOMM Incorporated, San Diego, CA (US)

(72) Inventors: Chirag Gulati, Kota (IN); Ritu Chaba, San Diego, CA (US); Lakshmikantha Holla Vakwadi, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 27 days.

(21) Appl. No.: 13/975,277

(22) Filed: Aug. 23, 2013

(65) Prior Publication Data

US 2015/0058686 A1 Feb. 26, 2015

(51) Int. Cl.
*G01R 31/3185* (2006.01)
*G11C 29/32* (2006.01)
*G11C 29/36* (2006.01)

(52) U.S. Cl.
CPC *G01R 31/318541* (2013.01); *G01R 31/318597* (2013.01); *G11C 29/32* (2013.01); *G11C 29/36* (2013.01); *G11C 2029/3202* (2013.01); *G11C 2029/3602* (2013.01)

(58) Field of Classification Search
CPC ............ G01R 31/318541; G01R 31/31917; G01R 31/318314; G01R 31/3185; G11C 29/32
USPC .................................................. 714/726, 727
See application file for complete search history.

(56) References Cited

U.S. PATENT DOCUMENTS

| 4,602,210 | A  | * | 7/1986 | Fasang et al. ................. 714/731 |
| 5,006,787 | A  | * | 4/1991 | Katircioglu et al. ......... 324/73.1 |
| 5,416,362 | A  |   | 5/1995 | Byers et al. |
| 5,951,702 | A  | * | 9/1999 | Lim et al. ...................... 714/718 |
| 6,265,922 | B1 |   | 7/2001 | Kirsch |
| 6,477,684 | B1 | * | 11/2002 | Sanghani ...................... 714/726 |
| 7,002,374 | B2 |   | 2/2006 | Anderson et al. |
| 7,246,287 | B1 | * | 7/2007 | Chua-Eoan et al. .......... 714/733 |
| 7,747,917 | B2 |   | 6/2010 | Putman et al. |
| 7,843,218 | B1 |   | 11/2010 | Ramaraju et al. |
| 8,331,163 | B2 |   | 12/2012 | Koeppe et al. |
| 8,332,698 | B2 |   | 12/2012 | Tang et al. |

(Continued)

OTHER PUBLICATIONS

Quasem, Md.S.; Gupta, S., "Designing reconfigurable multiple scan chains for systems-on-chip," VLSI Test Symposium, 2004. Proceedings. 22nd IEEE , vol., No., pp. 365,371, Apr. 25-29, 2004.*

(Continued)

*Primary Examiner* — Cynthia Britt
(74) *Attorney, Agent, or Firm* — Arent Fox LLP

(57) ABSTRACT

A method of operating an apparatus in a functional mode and an ATPG scan mode and an apparatus for use in a functional mode and an ATPG scan mode are provided. The apparatus includes a set of latches including a first latch and a second latch. The first latch is operated as a master latch and the second latch is operated as a master latch in the functional mode. The first latch is operated as a master latch of a flip-flop and the second latch is operated as a slave latch of the flip-flop in the ATPG scan mode. In one configuration, the apparatus includes a plurality of latches including at least the first and second latches, an output of each of the latches is coupled to a digital circuit, the apparatus includes a plurality of functional inputs, and each of the functional inputs is input to the digital circuit.

14 Claims, 15 Drawing Sheets

(56) References Cited

U.S. PATENT DOCUMENTS

| | | | |
|---|---|---|---|
| 2004/0078741 A1* | 4/2004 | Morton | 714/726 |
| 2006/0253754 A1* | 11/2006 | Gunda et al. | 714/726 |
| 2007/0001730 A1 | 1/2007 | Branch et al. | |
| 2008/0010573 A1* | 1/2008 | Sul | 714/731 |
| 2008/0307280 A1* | 12/2008 | Putman et al. | 714/727 |
| 2011/0307753 A1 | 12/2011 | Ogata | |
| 2012/0057411 A1* | 3/2012 | Koeppe et al. | 365/189.02 |
| 2012/0284577 A1 | 11/2012 | Sinanoglu | |

OTHER PUBLICATIONS

Zarrineh, K.; Upadhyaya, S.J.; Shephard, P., III, "Automatic insertion of scan structure to enhance testability of embedded memories, cores and chips," VLSI Test Symposium, 1998. Proceedings. 16th IEEE, vol., No., pp. 98, 103, Apr. 26-30, 1998.*

International Search Report and Written Opinion—PCT/US2014/052017—ISA/EPO—Jan. 26, 2015.

* cited by examiner

US 9,188,642 B2

RECONFIGURABLE MEMORY INTERFACE CIRCUIT TO SUPPORT A BUILT-IN MEMORY SCAN CHAIN

BACKGROUND

1. Field

The present disclosure relates generally to a memory interface circuit, and more particularly, to a reconfigurable memory interface circuit to support a built-in memory scan chain.

2. Background

To enable an automatic test pattern generation (ATPG) scan, a memory interface circuit within a memory may include scan latches that are used only for the ATPG scan. Including the scan latches increases an area overhead of the memory, as the scan latches are utilized only for the ATPG scan. Accordingly, methods and apparatuses are needed for enabling the ATPG scan without including the scan latches in the memory. Including the scan latches in the memory increases an area overhead of the memory.

SUMMARY

In an aspect of the disclosure, an apparatus for performing ATPG scans is provided. The apparatus includes a first multiplexer having a plurality of first multiplexer inputs and a first multiplexer output. The first multiplexer inputs are coupled to a first functional input, a second functional input, and a shift input. The first multiplexer is configured to select one of the first functional input, the second functional input, and the shift input to output at the first multiplexer output. The apparatus further includes a first latch having a first latch input and a first latch output. The first latch input is coupled to the first multiplexer output. The apparatus further includes a second multiplexer having a plurality of second multiplexer inputs and a second multiplexer output. The second multiplexer inputs are coupled to the second functional input and the first latch output. The second multiplexer is configured to select one of the second functional input and the first latch output to output at the second multiplexer output. The apparatus further includes a second latch having a second latch input. The second latch input is coupled to the second multiplexer output.

In an aspect of the disclosure, a method and an apparatus are provided. The method utilizes an apparatus in a functional mode and an ATPG scan mode. The apparatus includes a set of latches including a first latch and a second latch. In the method, the first latch is operated as a master latch and the second latch is operated as a master latch in the functional mode. In addition, the first latch is operated as a master latch of a flip-flop and the second latch is operated as a slave latch of the flip-flop in the ATPG scan mode.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
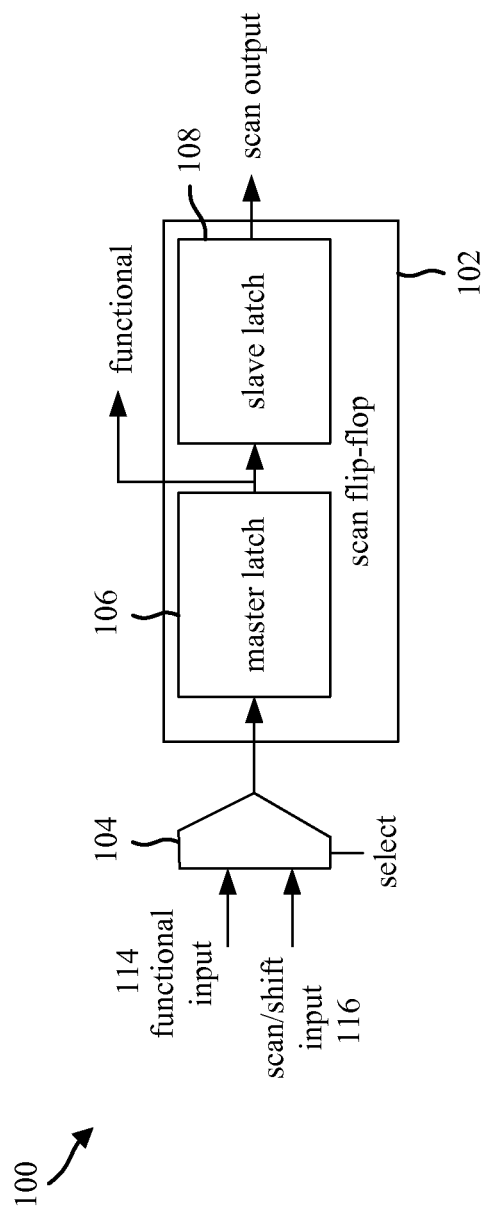
FIG. 1 is a diagram illustrating a scan cell.

FIG. 1 is a diagram 100 illustrating a scan cell. ATPG is an electronic design automation method used to generate input/test sequences that may be applied to a digital circuit in order to distinguish between correct circuit behavior and faulty circuit behavior of the digital circuit. An ATPG scan is the application of the generated input/test sequences to the digital circuit to enable detection of faults within the digital circuit. To enable scan testability during the ATPG scan, each input pin of a memory may be followed with a scan cell within the memory. As shown in FIG. 1, the scan cell includes a scan flip-flop 102 (also referred to as a master-slave flip-flop) and a multiplexer 104. The scan flip-flop 102 includes a master latch 106 followed by a slave latch 108. The slave latch 108 may be referred to as a scan latch. The output of the master latch 106 is input to the memory (functional path) and to the slave latch 108. The scan output of the slave latch 108 is utilized only in the ATPG scan. The multiplexer 104 receives a functional input 114 from a driving digital circuit to which the ATPG is applied and a scan/shift input 116. During normal operation, the slave latch 108 is disabled and the functional input 114 is selected at the multiplexer 104 and fed into the scan flip-flop 102. During an ATPG scan, the slave latch 108 is enabled, the functional input 114 is initially selected at the multiplexer 104 and fed into the scan flip-flop 102 during a parallel capture phase of the ATPG scan, and the scan/shift input 116 is subsequently selected at the multiplexer 104 and fed into the scan flip-flop 102 during a serial shift phase of the ATPG scan.

Figure 2:
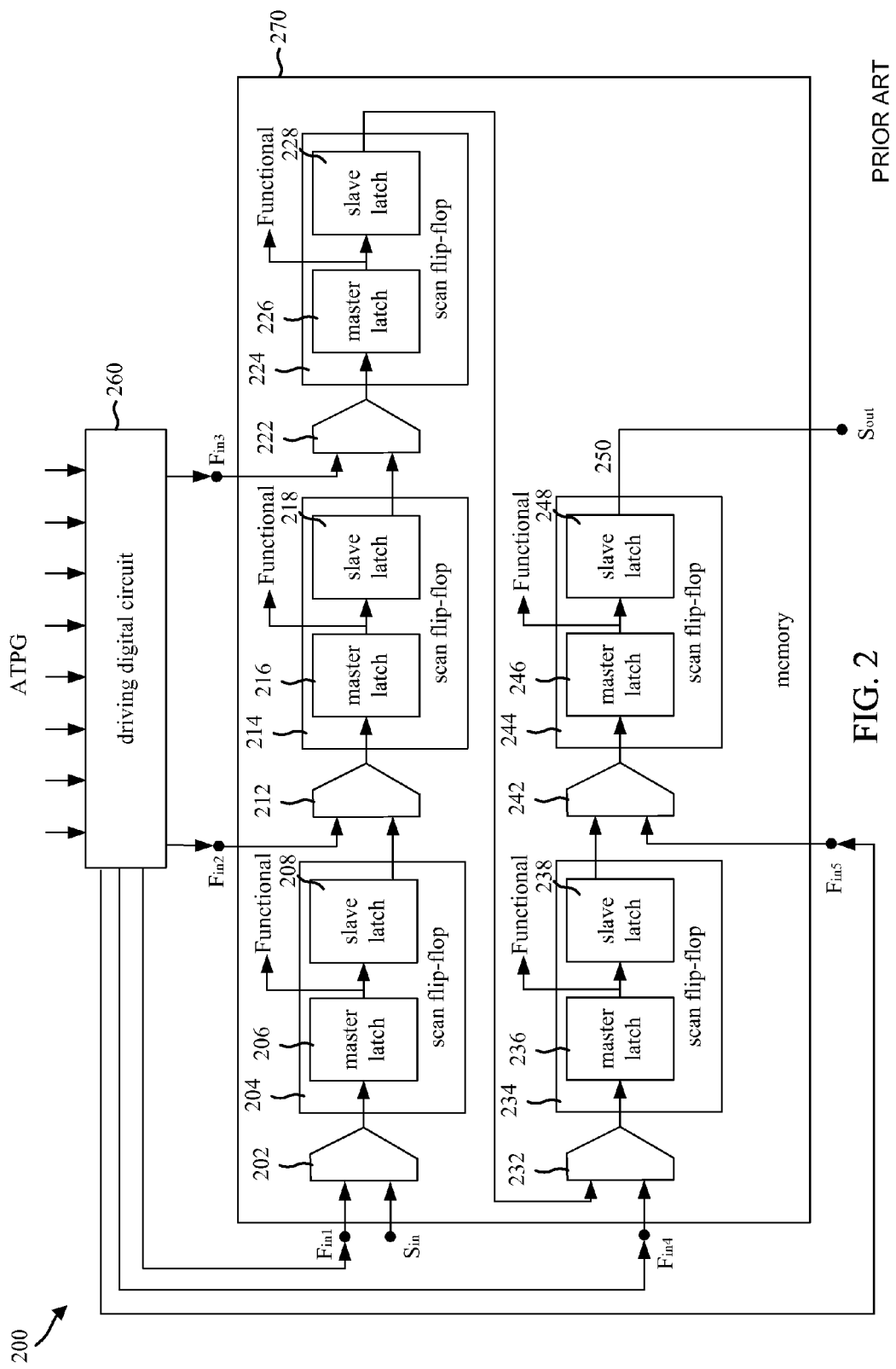
FIG. 2 is a diagram illustrating a conventional memory interface circuit.

FIG. 2 is a diagram 200 illustrating a conventional memory interface circuit. The conventional memory interface circuit includes a plurality of scan cells connected in series in a scan chain. As shown in FIG. 2, the memory scan chain includes five scan cells in series within a memory 270. A multiplexer 202 receives a first functional input $F_{in1}$ and a scan input $S_{in}$. An output of the multiplexer 202 is connected to a scan flip-flop 204. The scan flip-flop 204 includes a master latch 206 and a slave latch 208. The slave latch 208 outputs a scan output to a subsequent scan cell. A multiplexer 212 receives a second functional input $F_{in2}$ and a scan input that is output from the slave latch 208. An output of the multiplexer 212 is connected to a scan flip-flop 214. The scan flip-flop 214 includes a master latch 216 and a slave latch 218. The slave latch 218 outputs a scan output to a subsequent scan cell. A multiplexer 222 receives a third functional input $F_{in3}$ and a scan input that is output from the slave latch 218. An output of the multiplexer 222 is connected to a scan flip-flop 224. The scan flip-flop 224 includes a master latch 226 and a slave latch 228. The slave latch 228 outputs a scan output to a subsequent scan cell. A multiplexer 232 receives a fourth functional input $F_{in4}$ and a scan input that is output from the slave latch 228. An output of the multiplexer 232 is connected to a scan flip-flop 234. The scan flip-flop 234 includes a master latch 236 and a slave latch 238. The slave latch 238 outputs a scan output to a subsequent scan cell. A multiplexer 242 receives a fifth functional input $F_{in5}$ and a scan input that is output from the slave latch 238. An output of the multiplexer 242 is connected to a scan flip-flop 244. The scan flip-flop 244 includes a master latch 246 and a slave latch 248. The slave latch 248 outputs a scan output at the output $S_{out}$ 250. The functional inputs $F_{in1}$, $F_{in2}$, $F_{in4}$, and $F_{in5}$ and the scan input $S_{in}$ are input pins of the memory 270. The scan output $S_{out}$ is an output pin of the memory 270. The ATPG input/test sequence is applied to a driving digital circuit 260. The functional inputs $F_{in1}$, $F_{in2}$, $F_{in3}$, $F_{in4}$, and $F_{in5}$ are all output from the driving digital circuit 260.

Figure 3:
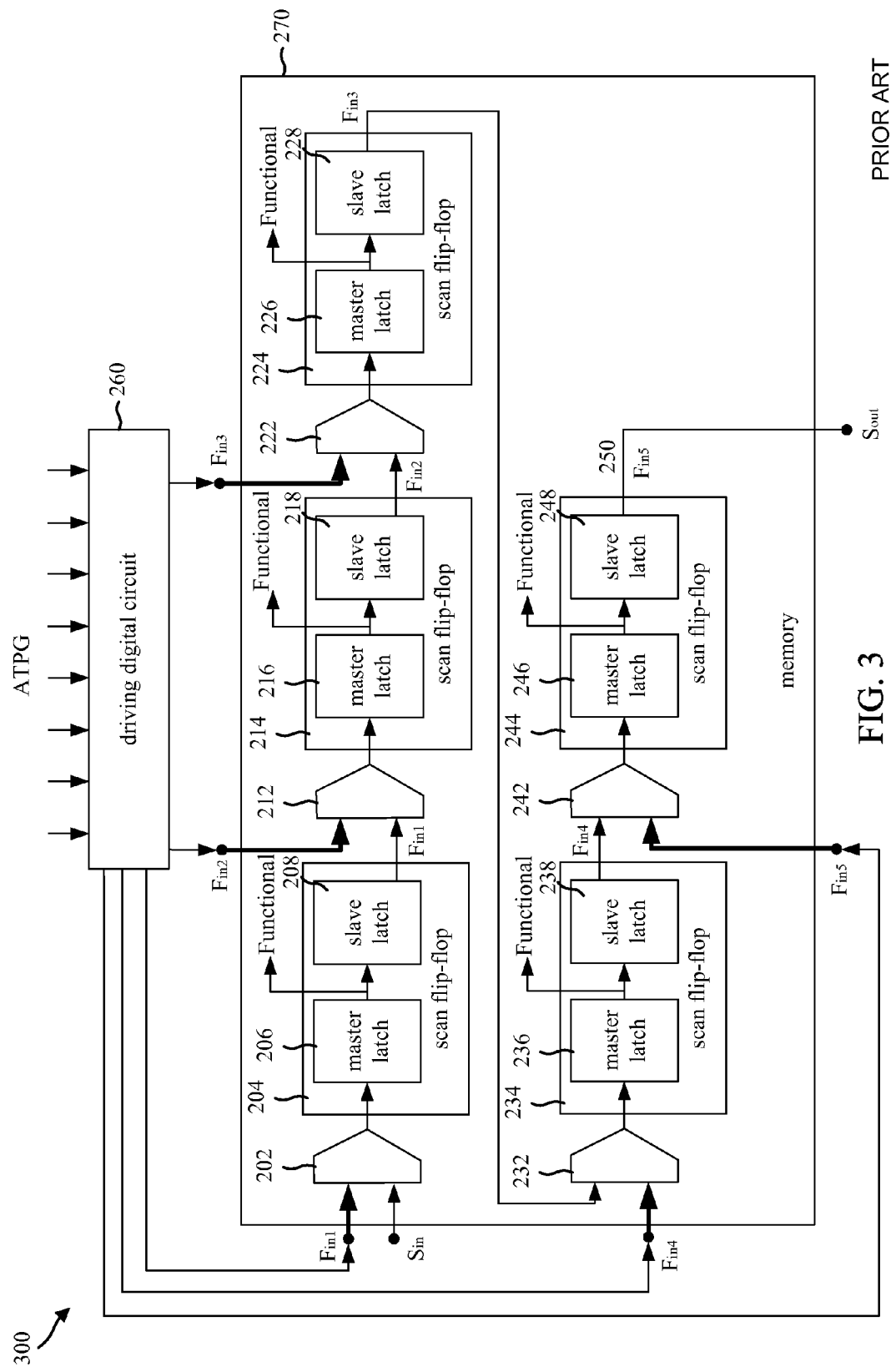
FIG. 3 is a diagram illustrating a parallel capture phase of an ATPG scan in a conventional memory interface circuit.

FIG. 3 is a diagram 300 illustrating a parallel capture phase of an ATPG scan in a conventional memory interface circuit. During a parallel capture phase of an ATPG scan, the functional input $F_{in1}$ is selected at the multiplexer 202 and fed into the scan flip-flop 204, the functional input $F_{in2}$ is selected at the multiplexer 212 and fed into the scan flip-flop 214, the functional input $F_{in3}$ is selected at the multiplexer 222 and fed into the scan flip-flop 224, the functional input $F_{in4}$ is selected at the multiplexer 232 and fed into the scan flip-flop 234, and the functional input $F_{in5}$ is selected at the multiplexer 242 and fed into the scan flip-flop 244. After the parallel capture phase of an ATPG scan, the functional inputs $F_{in1}$, $F_{in2}$, $F_{in3}$, $F_{in4}$, and $F_{in5}$ are latched (stored) into the scan flip-flops 204, 214, 224, 234, 244, respectively.

Figure 4:
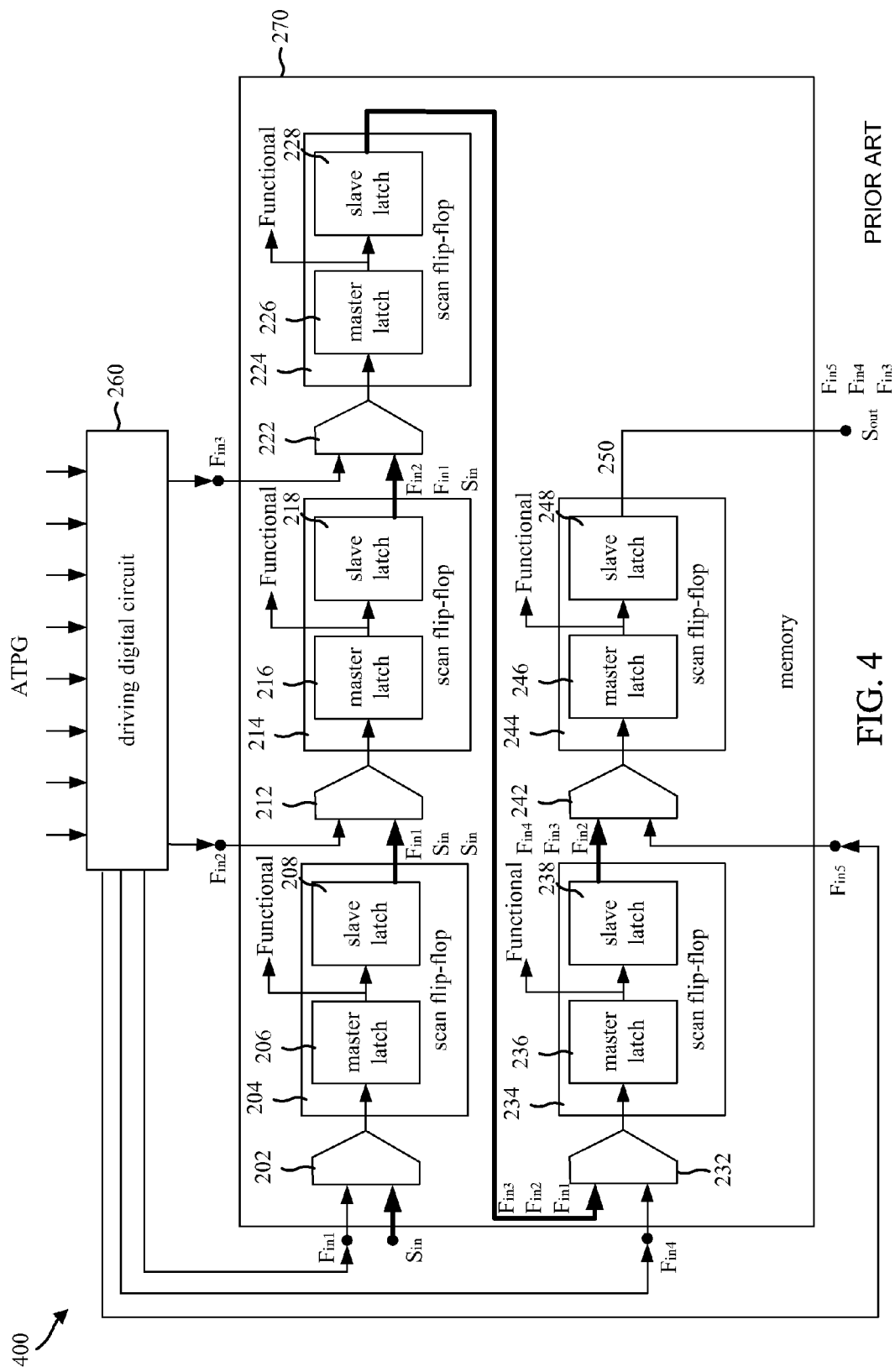
FIG. 4 is a diagram illustrating a serial shift phase of an ATPG scan in a conventional memory interface circuit.

FIG. 4 is a diagram 400 illustrating a serial shift phase of an ATPG scan in a conventional memory interface circuit. During a serial shift phase of an ATPG scan, the scan inputs are each selected at the multiplexers 202, 212, 222, 232, and 242, and the scan inputs and the functional inputs are shifted through the scan flip-flops 204, 214, 224, 234, 244. After a first shift, the scan input $S_{in}$ is latched into the scan flip-flop 204 and the functional inputs $F_{in1}$, $F_{in2}$, $F_{in3}$, and $F_{in4}$ are latched in the scan flip-flops 214, 224, 234, 244, respectively. After a second shift, the scan input $S_{in}$ is latched into the scan flip-flop 204, the scan input $S_{in}$ is latched in the scan flip-flop 214, and the functional inputs $F_{in1}$, $F_{in2}$, and $F_{in3}$ are latched into the scan flip-flops 224, 234, 244, respectively. As such, the output $S_{out}$ 250 outputs $F_{in5}$ during the parallel capture phase and then iteratively $F_{in4}$, $F_{in3}$, $F_{in2}$ and $F_{in1}$ during the serial shift phase. The values $F_{in5}$, $F_{in4}$, $F_{in3}$, $F_{in2}$ and $F_{in1}$ may be compared to expected values from the input/test sequence from the ATPG to determine whether the driving digital circuit 260 has any faults.

Figure 5:
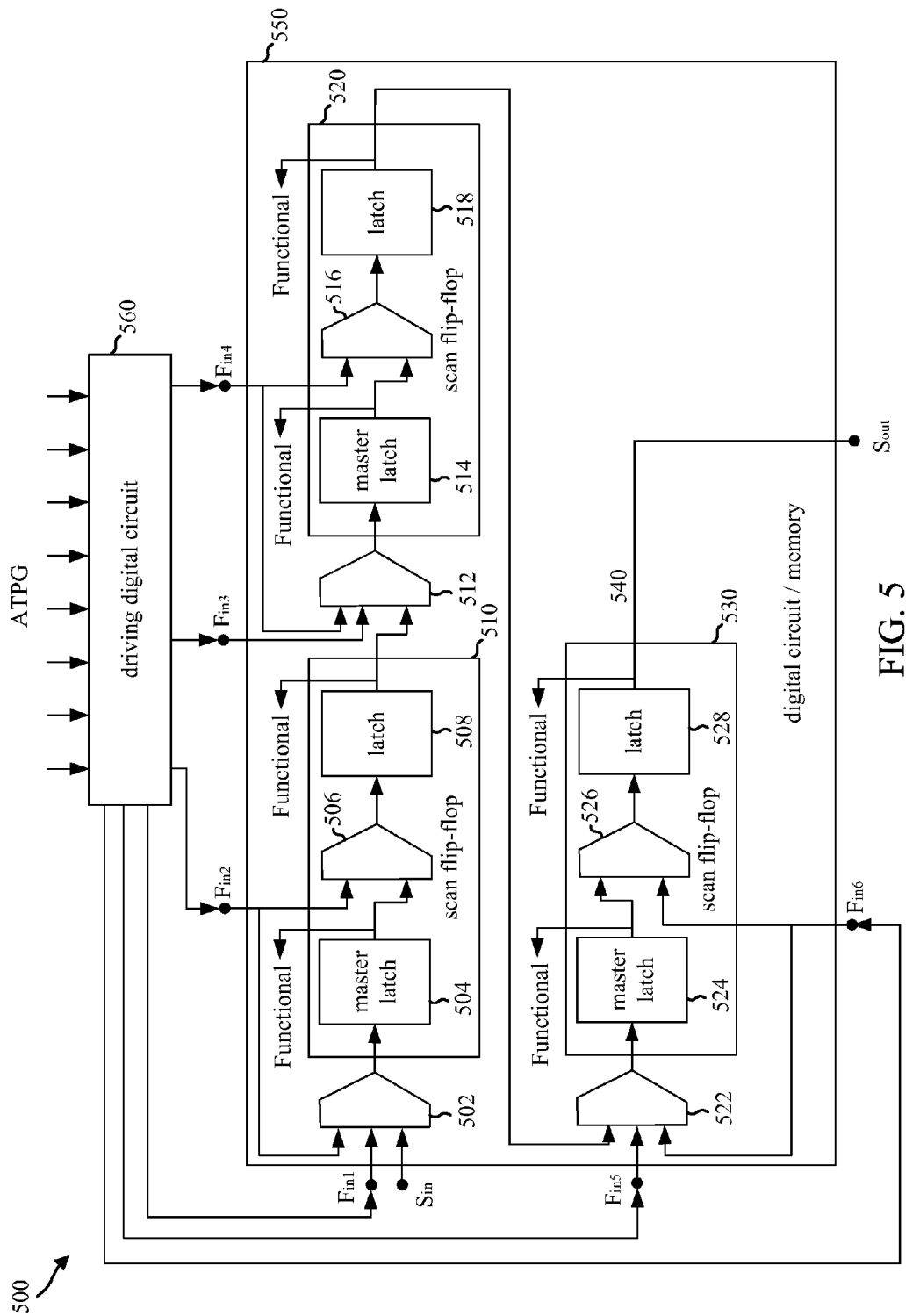
FIG. 5 is a diagram illustrating an exemplary interface circuit.

FIG. 5 is a diagram 500 illustrating an exemplary interface circuit. The interface circuit may be an interface to a digital circuit and/or a memory interface circuit. In order to reduce an area overhead of a digital circuit/memory 550, slave latches utilized for the ATPG scan are removed (e.g., the slave latches 208, 218, 228, 238, 248 in FIG. 2 are removed). In addition, inputs to a subset of the multiplexers 502, 512, 522 are changed in comparison to the conventional memory interface circuit (see, e.g., the multiplexers 202, 222, 242 of FIG. 2). As shown in FIG. 5, the exemplary memory interface circuit includes a multiplexer 502 with a functional input $F_{in1}$, a functional input $F_{in2}$, and a scan input $S_{in}$. The output of the multiplexer 502 is input into a master latch 504. The output of the master latch 504 is an input to the digital circuit/memory 550 (functional) and an input to a multiplexer 506. The multiplexer 506 has two inputs: (1) the functional input $F_{in2}$ and (2) the output of the master latch 504. The output of the multiplexer 506 is input into a latch 508. The output of the latch 508 is an input to the digital circuit/memory 550 (functional) and an input to a multiplexer 512. The multiplexer 512 has three inputs: (1) a functional input $F_{in3}$, (2) a functional input $F_{in4}$, and (3) the output of the latch 508. The output of the multiplexer 512 is input into a master latch 514. The output of the master latch 514 is an input to the digital circuit/memory 550 (functional) and an input to a multiplexer 516. The multiplexer 516 has two inputs: (1) the functional input $F_{in4}$ and (2) the output of the master latch 514. The output of the multiplexer 516 is input into a latch 518. The output of the latch 518 is an input to the digital circuit/memory 550 (functional) and an input to a multiplexer 522. The multiplexer 522 has three inputs: (1) a functional input $F_{in5}$, (2) a functional input $F_{in6}$, and (3) the output of the latch 518. The output of the multiplexer 522 is input into a master latch 524. The output of the master latch 524 is an input to the digital circuit/memory 550 (functional) and an input to a multiplexer 526. The multiplexer 526 has two inputs: (1) the functional input $F_{in6}$ and (2) the output of the master latch 524. The output of the multiplexer 526 is input into a latch 528. The output of the latch 528 is an input to the digital circuit/memory 550 (functional) and is connected to an output pin $S_{out}$ 540 of the digital circuit/memory 550. The scan input $S_{in}$ and the functional inputs $F_{in1}$, $F_{in2}$, $F_{in3}$, $F_{in4}$, $F_{in5}$, and $F_{in6}$ are all input pins of the digital circuit/memory 550.

In a functional mode (non-ATPG scan mode), the latches 504, 508, 514, 518, 524, 528 are all operated as master latches. In an ATPG scan mode, the latches 504, 514, 524 are operated as master latches and the latches 508, 518, 528 are operated as slave latches. In an ATPG scan mode, the master latch 504, the multiplexer 506, and the latch 508 operate as a scan flip-flop 510; the master latch 514, the multiplexer 516, and the latch 518 operate as a scan flip-flop 520; and the master latch 524, the multiplexer 526, and the latch 528 operate as a scan flip-flop 530. In an ATPG scan, the ATPG input/test sequence is applied to a driving digital circuit 560. The functional inputs $F_{in1}$, $F_{in2}$, $F_{in3}$, $F_{in4}$, $F_{in5}$, and $F_{in6}$ are all output from the driving digital circuit 560. As shown in FIG. 5, the digital circuit/memory 550 includes one scan chain of length three. However, the digital circuit/memory 550 may include multiple scan chains that are not internally connected in series. Each scan chain may have a scan input $S_{in}$ and a scan output $S_{out}$. An ATPG scan may be performed on each of the scan chains. Alternatively, the multiple scan chains may be connected in series to form one scan chain by externally connecting a scan output of one scan chain to a scan input of another scan chain, and one ATPG scan may be performed on the one scan chain.

Figure 6:
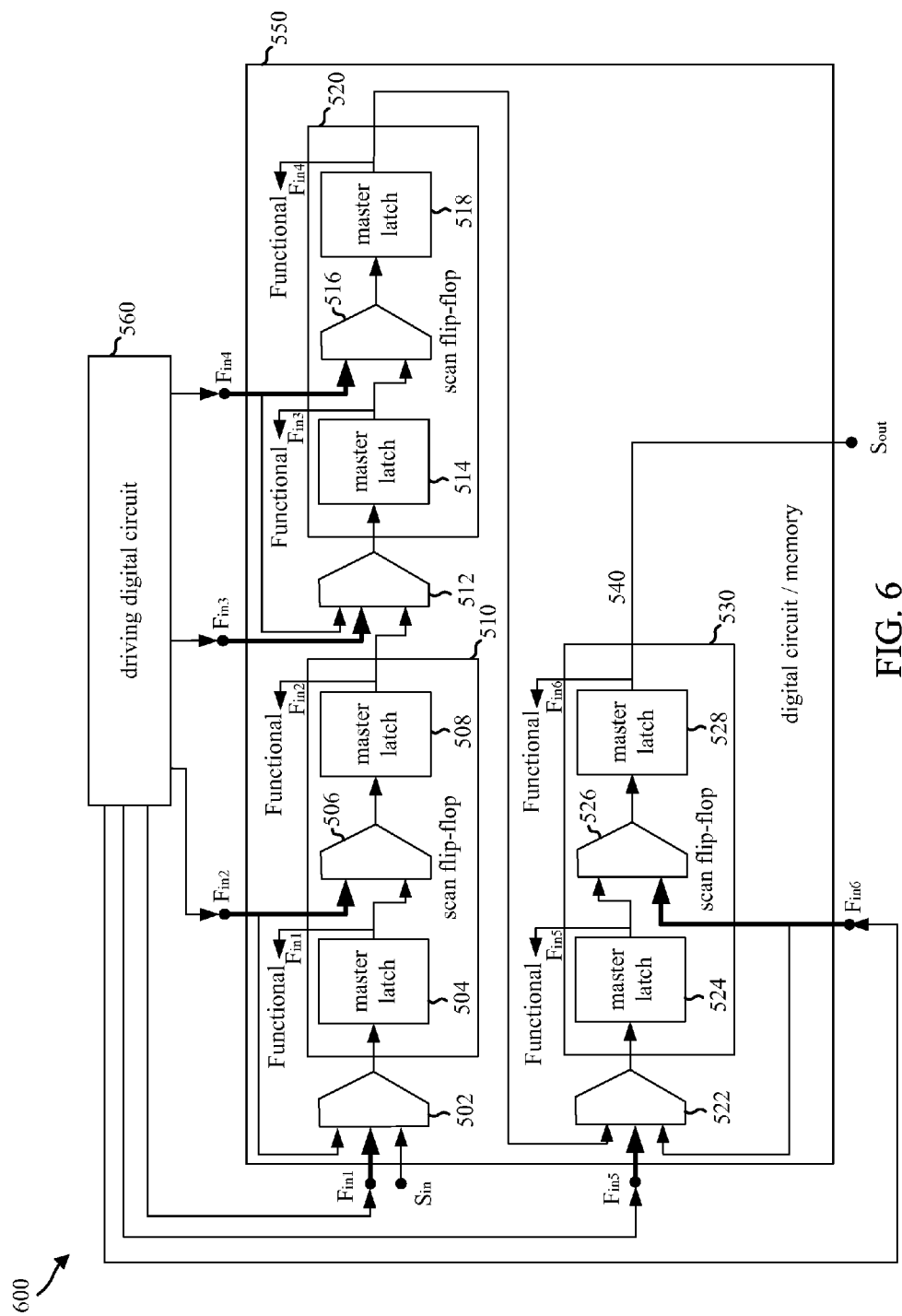
FIG. 6 is a diagram illustrating the exemplary interface circuit in a functional mode.

FIG. 6 is a diagram 600 illustrating the exemplary interface circuit in a functional mode. In a functional mode (non-ATPG scan mode), the latches 504, 508, 514, 518, 524, 528 are all operated as master latches. In the functional mode, the functional input $F_{in1}$ is selected at the multiplexer 502, the functional input $F_{in2}$ is selected at the multiplexer 506, the functional input $F_{in3}$ is selected at the multiplexer 512, the functional input $F_{in4}$ is selected at the multiplexer 516, the functional input $F_{in5}$ is selected at the multiplexer 522, and the functional input $F_{in6}$ is selected at the multiplexer 526. The functional inputs $F_{in1}$, $F_{in2}$, $F_{in3}$, $F_{in4}$, $F_{in5}$, and $F_{in6}$ are input to the digital circuit/memory 550.

Figure 7:
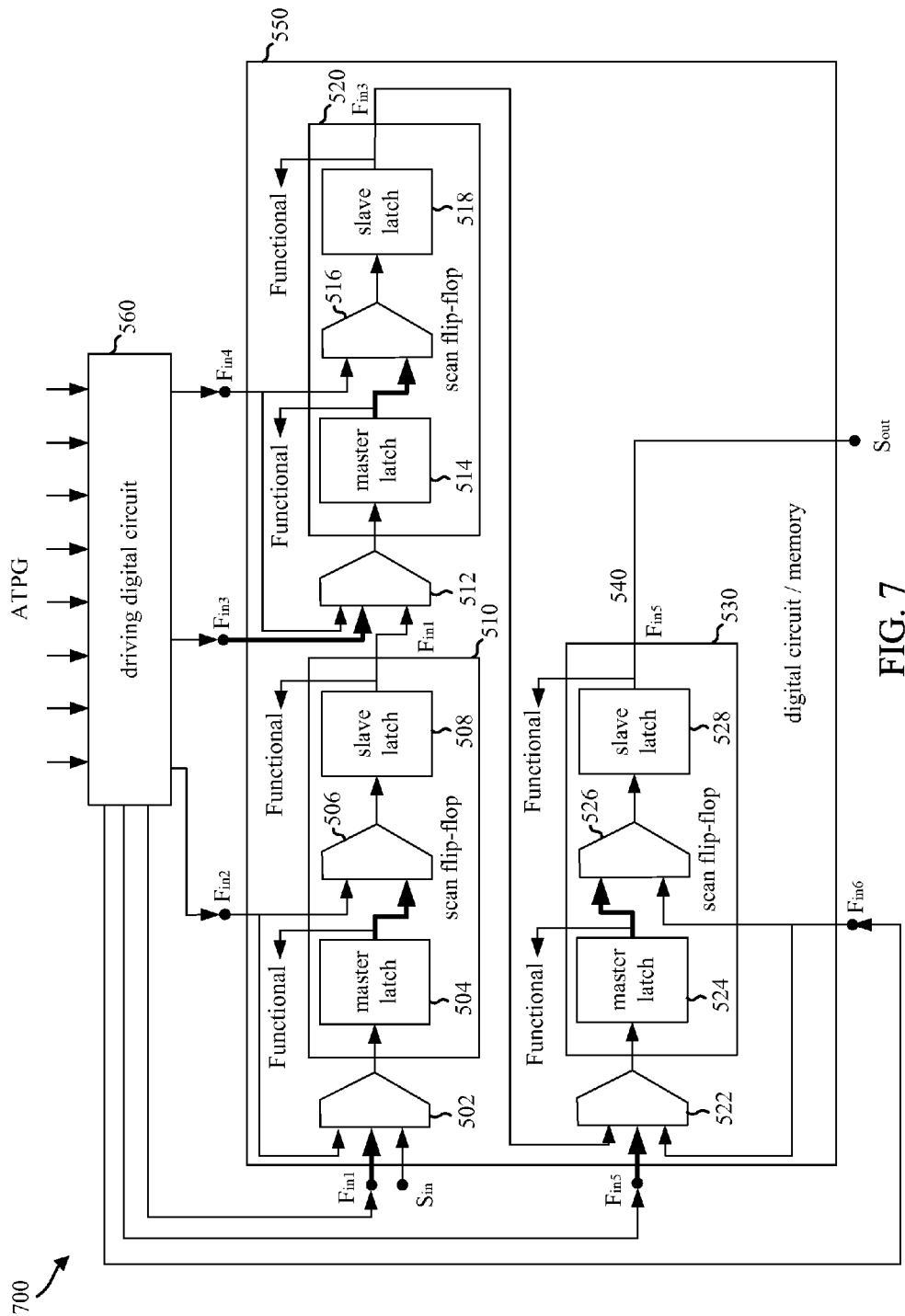
FIG. 7 is a diagram illustrating the exemplary interface circuit in a parallel capture phase of a first ATPG scan.

FIG. 7 is a diagram 700 illustrating the exemplary interface circuit in a parallel capture phase of a first ATPG scan. In an ATPG scan mode, the latches 504, 514, 524 are operated as master latches and the latches 508, 518, 528 are operated as slave latches. The ATPG input/test sequence is applied to a driving digital circuit 560. The functional inputs $F_{in1}$, $F_{in2}$, $F_{in3}$, $F_{in4}$, $F_{in5}$, and $F_{in6}$ are all output from the driving digital circuit 560. In the parallel capture phase of the first ATPG scan, the multiplexer 502 selects the functional input $F_{in1}$, the multiplexer 506 selects the output of the master latch 504, the multiplexer 512 selects the functional input $F_{in3}$, the multiplexer 516 selects the output of the master latch 514, the multiplexer 522 selects the functional input $F_{in5}$, and the multiplexer 526 selects the output of the master latch 524. In the parallel capture phase of the first ATPG scan, the functional inputs $F_{in2}$, $F_{in4}$, and $F_{in6}$ are not selected by any of the multiplexers. After the parallel capture phase of the first ATPG scan, the functional inputs $F_{in1}$, $F_{in3}$, $F_{in5}$ are latched into the scan flip-flops 510, 520, 530.

Figure 8:
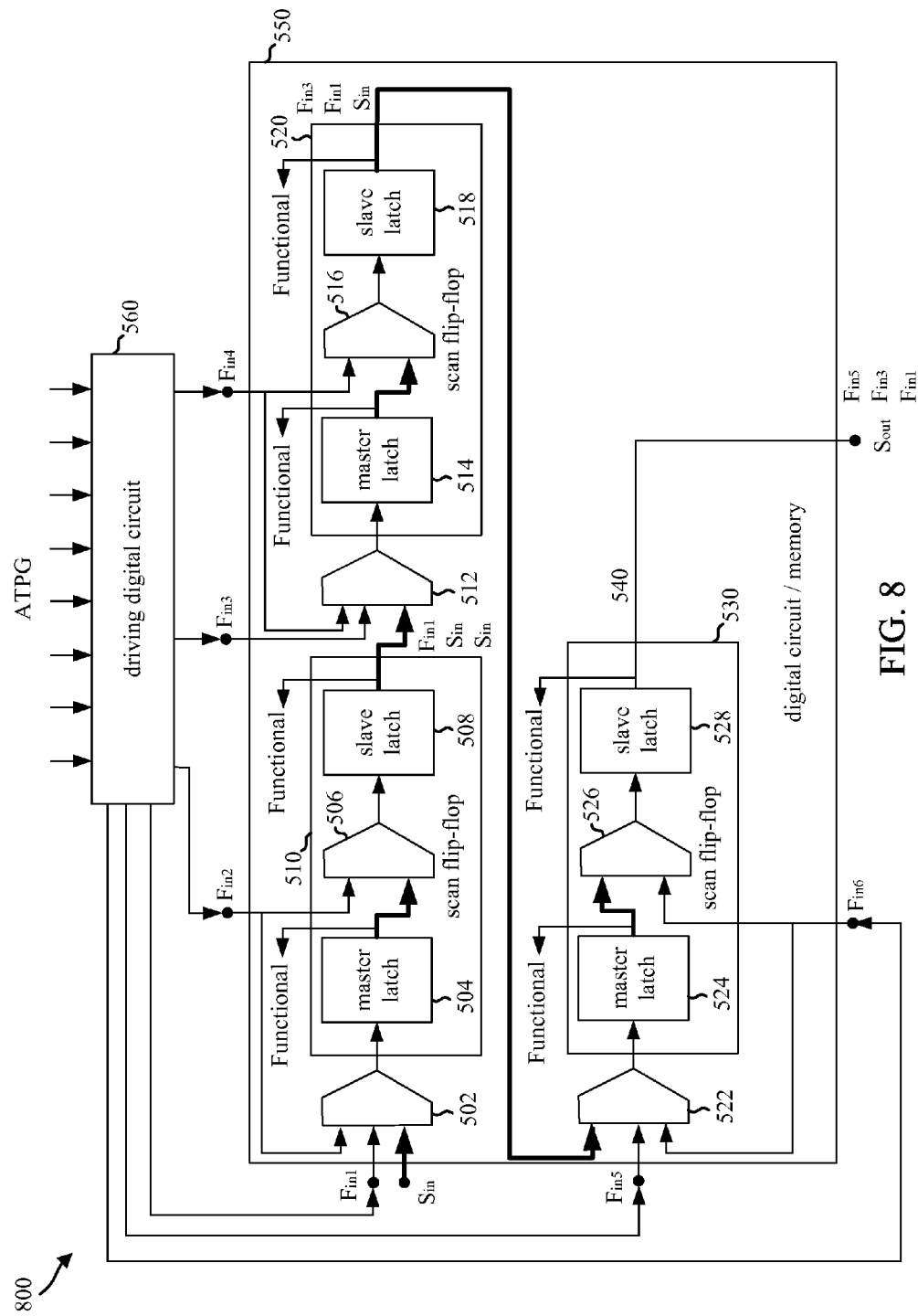
FIG. 8 is a diagram illustrating the exemplary interface circuit in a serial shift phase of the first ATPG scan.

FIG. 8 is a diagram 800 illustrating the exemplary interface circuit in a serial shift phase of the first ATPG scan. In the serial shift phase of the first ATPG scan, the multiplexer 502 selects the scan input $S_{in}$, the multiplexer 506 selects the output of the master latch 504, the multiplexer 512 selects the output of the slave latch 508, the multiplexer 516 selects the output of the master latch 514, the multiplexer 522 selects the output of the slave latch 518, and the multiplexer 526 selects the output of the master latch 524. After a first shift, the scan input $S_{in}$ is latched into the scan flip-flop 510, the functional input $F_{in1}$ is latched into the scan flip-flop 520, and the functional input $F_{in3}$ is latched into the scan flip-flop 530. After a second shift, the scan input $S_{in}$ is latched into the scan flip-flop 510, the scan input $S_{in}$ is latched into the scan flip-flop 520, and the functional input $F_{in1}$ is latched into the scan flip-flop 530. As such, the output $S_{out}$ 540 outputs $F_{in5}$ during the parallel capture phase of the first ATPG scan and then iteratively outputs $F_{in3}$ and $F_{in1}$ during the serial shift phase of the first ATPG scan. The values $F_{in5}$, $F_{in3}$, and $F_{in1}$ may be compared to expected values from the input/test sequence from the ATPG to determine whether the driving digital circuit 560 has any faults.

Figure 9:
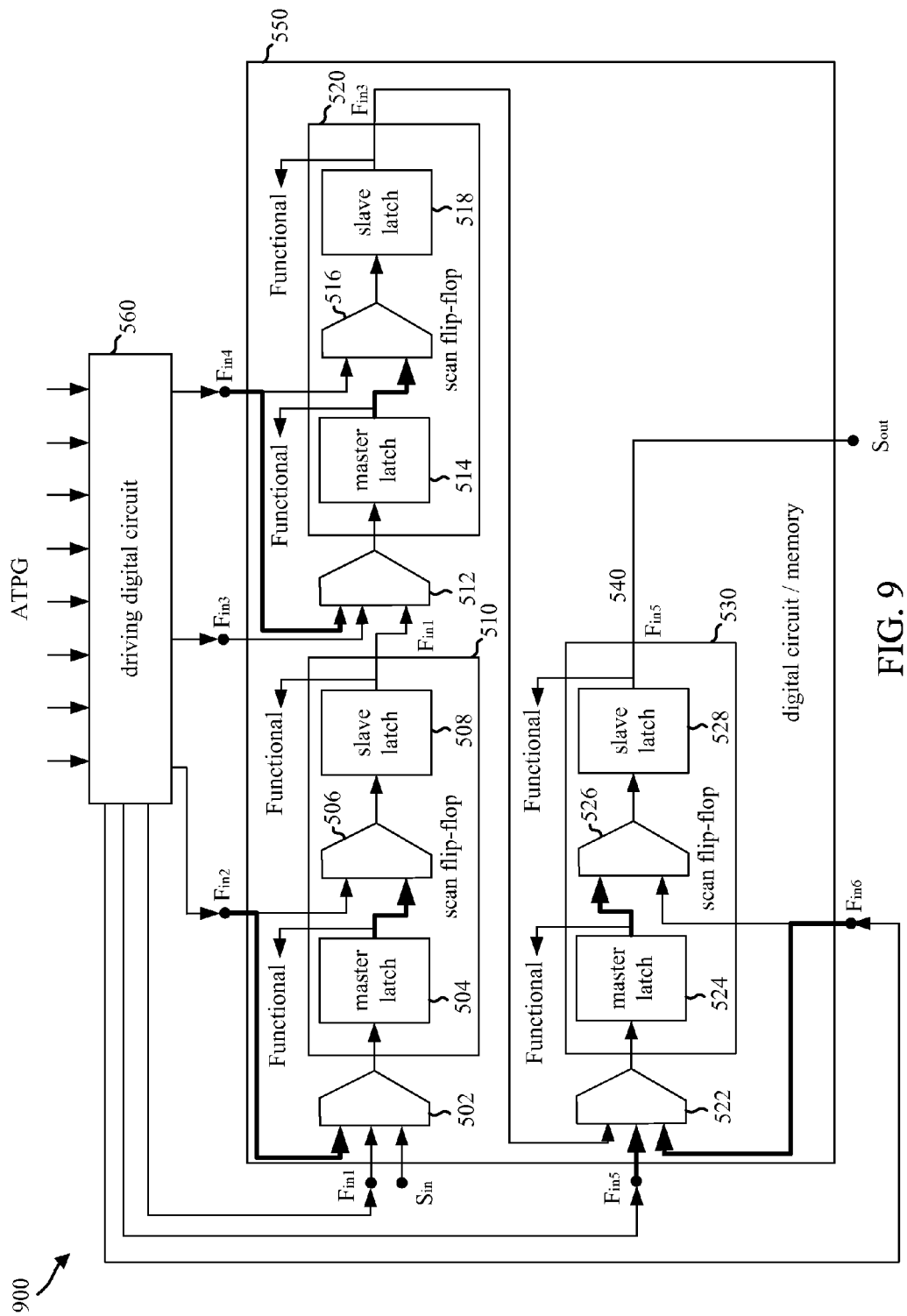
FIG. 9 is a diagram illustrating the exemplary interface circuit in a parallel capture phase of a second ATPG scan.

FIG. 9 is a diagram 900 illustrating the exemplary interface circuit in a parallel capture phase of a second ATPG scan. In an ATPG scan mode, the latches 504, 514, 524 are operated as master latches and the latches 508, 518, 528 are operated as slave latches. The ATPG input/test sequence is applied to a driving digital circuit 560. The functional inputs $F_{in1}$, $F_{in2}$, $F_{in3}$, $F_{in4}$, $F_{in5}$, and $F_{in6}$ are all output from the driving digital circuit 560. In the parallel capture phase of the second ATPG scan, the multiplexer 502 selects the functional input $F_{in2}$, the multiplexer 506 selects the output of the master latch 504, the multiplexer 512 selects the functional input $F_{in4}$, the multiplexer 516 selects the output of the master latch 514, the multiplexer 522 selects the functional input $F_{in6}$, and the multiplexer 526 selects the output of the master latch 524. In the parallel capture phase of the second ATPG scan, the functional inputs $F_{in1}$, $F_{in3}$, and $F_{in5}$ are not selected by any of the multiplexers. After the parallel capture phase of the second ATPG scan, the functional inputs $F_{in2}$, $F_{in4}$, $F_{in6}$ are latched into the scan flip-flops 510, 520, 530.

Figure 10:
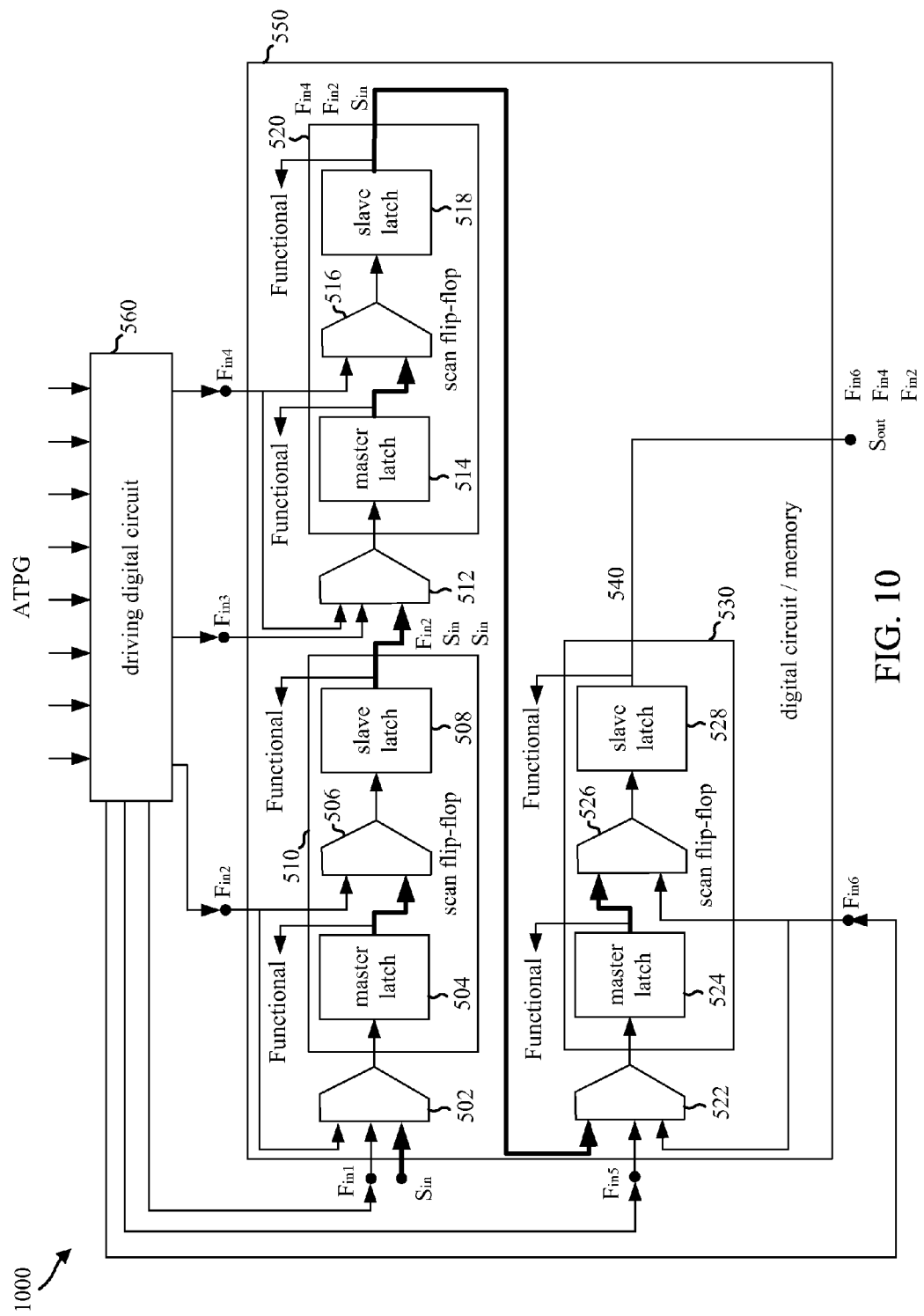
FIG. 10 is a diagram illustrating the exemplary interface circuit in a serial shift phase of the second ATPG scan.

FIG. 10 is a diagram 1000 illustrating the exemplary interface circuit in a serial shift phase of the second ATPG scan. In the serial shift phase of the second ATPG scan, the multiplexer 502 selects the scan input $S_{in}$, the multiplexer 506 selects the output of the master latch 504, the multiplexer 512 selects the output of the slave latch 508, the multiplexer 516 selects the output of the master latch 514, the multiplexer 522 selects the output of the slave latch 518, and the multiplexer 526 selects the output of the master latch 524. After a first shift, the scan input $S_{in}$ is latched into the scan flip-flop 510, the functional input $F_{in2}$ is latched into the scan flip-flop 520, and the functional input $F_{in4}$ is latched into the scan flip-flop 530. After a second shift, the scan input $S_{in}$ is latched into the scan flip-flop 510, the scan input $S_{in}$ is latched into the scan flip-flop 520, and the functional input $F_{in2}$ is latched into the scan flip-flop 530. As such, the output $S_{out}$ 540 outputs $F_{in6}$ during the parallel capture phase of the second ATPG scan and then iteratively outputs $F_{in4}$ and $F_{in2}$ during the serial shift phase of the second ATPG scan. The values $F_{in6}$, $F_{in4}$, and $F_{in2}$ may be compared to expected values from the input/test sequence from the ATPG to determine whether the driving digital circuit 560 has any faults.

As described supra, the exemplary methods and apparatuses enable an ATPG scan without including the scan latches (e.g., the slave latch 108 of FIG. 1, and the slave latches 208, 218, 228, 238, 248 of FIGS. 2, 3, and 4) in the digital circuit/memory 550. By removing the scan latches in the digital circuit/memory, an area overhead of the digital circuit/memory may be reduced. In order to perform the ATPG scan when the scan latches are removed, the ATPG scan is split into two ATPG scans. A first ATPG scan tests a first set of functional inputs (e.g., $F_{in1}$, $F_{in4}$, $F_{in6}$) and the second ATPG scan tests a second set of functional inputs (e.g., $F_{in2}$, $F_{in4}$, $F_{in6}$). The interface circuit enables both ATPG scans by providing the second set of functional inputs to multiplexers that also receive as inputs the first set of functional inputs. For example, the multiplexers 502, 512, 522 receive the first set of functional inputs $F_{in1}$, $F_{in3}$, $F_{in5}$, respectively; the multiplexers 506, 516, 526 receive the second set of functional inputs $F_{in2}$, $F_{in4}$, $F_{in6}$, respectively; and the multiplexers 502, 512, 522 additionally receive the second set of functional inputs $F_{in2}$, $F_{in4}$, $F_{in6}$, respectively. Splitting one ATPG scan of length n into two ATPG scans each of length n/2 may further provide the benefit of allowing ATPG scans when test equipment only supports up to length m scans, where n/2≤m<n. While FIGS. 5-10 illustrate an interface circuit with one scan chain, the interface circuit may include multiple scan chains. In addition, while FIGS. 5-10 illustrate an interface circuit with a scan chain length of six the exemplary methods and apparatuses are applicable to any scan chain length. Further, the exemplary interface circuit is applicable generally to any digital circuit, and more specifically, to a memory.

Referring again to FIGS. 5-10, the digital circuit/memory 550 includes a first multiplexer 502 that has a plurality of first multiplexer inputs and a first multiplexer output. The first multiplexer inputs are coupled to a first functional input $F_{in1}$, a second functional input $F_{in2}$, and a shift input $S_{in}$. The first multiplexer 502 is configured to select one of the first functional input $F_{in1}$, the second functional input $F_{in2}$, or the shift input $S_{in}$ to output at the first multiplexer output. A first latch 504 has a first latch input and a first latch output. The first latch input is coupled to the first multiplexer output. A second multiplexer 506 has a plurality of second multiplexer inputs and a second multiplexer output. The second multiplexer inputs are coupled to the second functional input $F_{in2}$ and the first latch output. The second multiplexer 506 is configured to select one of the second functional input $F_{in2}$ or the first latch output to output at the second multiplexer output. A second latch 508 has a second latch input being coupled to the second multiplexer output.

The second latch 508 has a second latch output. The digital circuit/memory 550 includes a plurality of latches. The plurality of latches include at least the first latch 504 and the second latch 508. The output of each of the plurality of latches is coupled to the digital circuit/memory 550. The digital circuit/memory 550 includes a plurality of functional inputs $F_{in1}, F_{in2}, \ldots, F_{inn}$, and each of the functional inputs is input to the digital circuit/memory 550. The digital circuit 550 may be a memory, and the functional inputs may be input pins of the memory.

The digital circuit/memory 550 may include n functional inputs. The n functional inputs include at least the first functional input $F_{in1}$ and the second functional input $F_{in2}$. The first latch 504 is configured to operate as a master latch of a flip-flop 510 and the second latch 508 is configured to operate as a slave latch of the flip-flop 510 in an ATPG scan mode when performing a first ATPG scan of a first set of $n_1$ functional inputs of the n functional inputs (e.g., in FIG. 5, the first set of three ($n_1$=3) functional inputs $F_{in1}, F_{in3}, F_{in5}$ of the six (n=6) functional inputs $F_{in1}, F_{in2}, F_{in3}, F_{in4}, F_{in5}$, and $F_{in6}$). The $n_1$ functional inputs include at least the first functional input $F_{in1}$. When performing a second ATPG scan of a second set of $n_2$ functional inputs of the n functional inputs, where $n_2=n-n_1$ (e.g., in FIG. 5, the second set of three ($n_2$=3) functional inputs $F_{in2}, F_{in4}, F_{in6}$ of the six (n=6) functional inputs $F_{in1}, F_{in2}, F_{in3}, F_{in4}, F_{in5}$, and $F_{in6}$), the first set of functional inputs are different than the second set of functional inputs, and the $n_2$ functional inputs include at least the second functional input $F_{in2}$. The values $n_1$ and $n_2$ may each approximately equal to n/2. The value n may be an even integer with $n_1=n_2$.

The first latch 504 is configured to operate as a master latch of a flip-flop 510 and the second latch 508 is configured to operate as a slave latch of the flip-flop 510 during an ATPG scan. As shown and described in relation to FIG. 7, the first multiplexer 502 is configured to select the first functional input $F_{in1}$ during a capture phase of an ATPG scan, and the second multiplexer 506 is configured to select the first latch output during the capture phase of the ATPG scan. The first latch 504 and the second latch 508 are configured to store the first functional input $F_{in1}$ during the capture phase of the ATPG scan. As shown and described in relation to FIG. 8, the first multiplexer 502 is configured to select the shift input $S_{in}$ during a shift phase of the ATPG scan, and the second multiplexer 506 is configured to select the first latch output during the shift phase of the ATPG scan. The first latch 504 and the second latch 508 are configured to store the shift input $S_{in}$ during the shift phase of the ATPG scan.

As shown and described in relation to FIG. 9, the first multiplexer 502 is configured to select the second functional input $F_{in2}$ during a capture phase of a second ATPG scan, and the second multiplexer 506 is configured to select the first latch output during the capture phase of the second ATPG scan. The first latch 504 and the second latch 508 are configured to store the second functional input $F_{in2}$ during the capture phase of the second ATPG scan. As shown and described in relation to FIG. 10, the first multiplexer 502 is configured to select the shift input $S_{in}$ during a shift phase of the second ATPG scan, and the second multiplexer 506 is configured to select the first latch output during the shift phase of the second ATPG scan. The first latch 504 and the second latch 508 are configured to store the shift input $S_{in}$ during the shift phase of the second ATPG scan.

The second latch 508 has a second latch output and the digital circuit/memory 550 further includes a third multiplexer 512. The third multiplexer 512 has a plurality of third multiplexer inputs and a third multiplexer output. The third multiplexer inputs are coupled to a third functional input $F_{in3}$, a fourth functional input $F_{in4}$, and the second latch output. The third multiplexer 512 is configured to select one of the third functional input $F_{in3}$, the fourth functional input $F_{in4}$, or the second latch output to output at the third multiplexer output. A third latch 514 has a third latch input and a third latch output. The third latch input is coupled to the third multiplexer output. A fourth multiplexer 516 has a plurality of fourth multiplexer inputs and a fourth multiplexer output. The fourth multiplexer inputs are coupled to the fourth functional input $F_{in4}$ and the third latch output. The fourth multiplexer 516 is configured to select one of the fourth functional input $F_{in4}$ or the third latch output to output at the fourth multiplexer output. A fourth latch 518 has a fourth latch input. The fourth latch input is coupled to the fourth multiplexer output.

The first latch 504 is configured to operate as a master latch of a flip-flop 510 and the second latch 508 is configured to operate as a slave latch of the flip-flop 510 during an ATPG scan. The third latch 514 is configured to operate as a master latch of a second flip-flop 520 and the fourth latch 518 is configured to operate as a slave latch of the second flip-flop 520 during an ATPG scan. As shown and described in relation to FIG. 7, the first multiplexer 502 is configured to select the first functional input $F_{in1}$ during a capture phase of an ATPG scan, and the second multiplexer 506 is configured to select the first latch output during the capture phase of the ATPG scan. The third multiplexer 512 is configured to select the third functional input $F_{in3}$ during the capture phase of the ATPG scan, and the fourth multiplexer 516 is configured to select the third latch output during the capture phase of the ATPG scan. The first latch 504 and the second latch 508 are configured to store the first functional input $F_{in1}$ during the capture phase of the ATPG scan. The third latch 514 and the fourth latch 518 are configured to store the third functional input $F_{in3}$ during the capture phase of the ATPG scan. As shown and described in relation to FIG. 8, the first multiplexer 502 is configured to select the shift input $S_{in}$ during a shift phase of the ATPG scan, and the second multiplexer 506 is configured to select the first latch output during the shift phase of the ATPG scan. The third multiplexer 512 is configured to select the second latch output during the shift phase of the ATPG scan, and the fourth multiplexer 516 is configured to select the third latch output during the shift phase of the ATPG scan. The first latch 504 and the second latch 508 are configured to store the shift input $S_{in}$ during the shift phase of the ATPG scan. The third latch 514 and the fourth latch 518 are configured to store the second latch output during the shift phase of the ATPG scan.

As shown and described in relation to FIG. 9, the first multiplexer 502 is configured to select the second functional input $F_{in2}$ during a capture phase of a second ATPG scan, and the second multiplexer 506 is configured to select the first latch output during the capture phase of the second ATPG scan. The third multiplexer 512 is configured to select the fourth functional input $F_{in4}$ during the capture phase of the second ATPG scan, and the fourth multiplexer 516 is configured to select the third latch output during the capture phase of the second ATPG scan. The first latch 504 and the second latch 508 are configured to store the second functional input $F_{in2}$ during the capture phase of the second ATPG scan. The third latch 514 and the fourth latch 518 are configured to store the fourth functional input $F_{in4}$ during the capture phase of the second ATPG scan. As shown and described in relation to FIG. 10, the first multiplexer 502 is configured to select the shift input $S_{in}$ during a shift phase of the second ATPG scan, and the second multiplexer 506 is configured to select the first latch output during the shift phase of the second ATPG scan. The third multiplexer 512 is configured to select the second latch output during the shift phase of the second ATPG scan, and the fourth multiplexer 516 is configured to select the third latch output during the shift phase of the second ATPG scan. The first latch 504 and the second latch 508 are configured to store the shift input $S_{in}$ during the shift phase of the second ATPG scan. The third latch 514 and the fourth latch 518 are configured to store the second latch output during the shift phase of the second ATPG scan.

Figure 11:
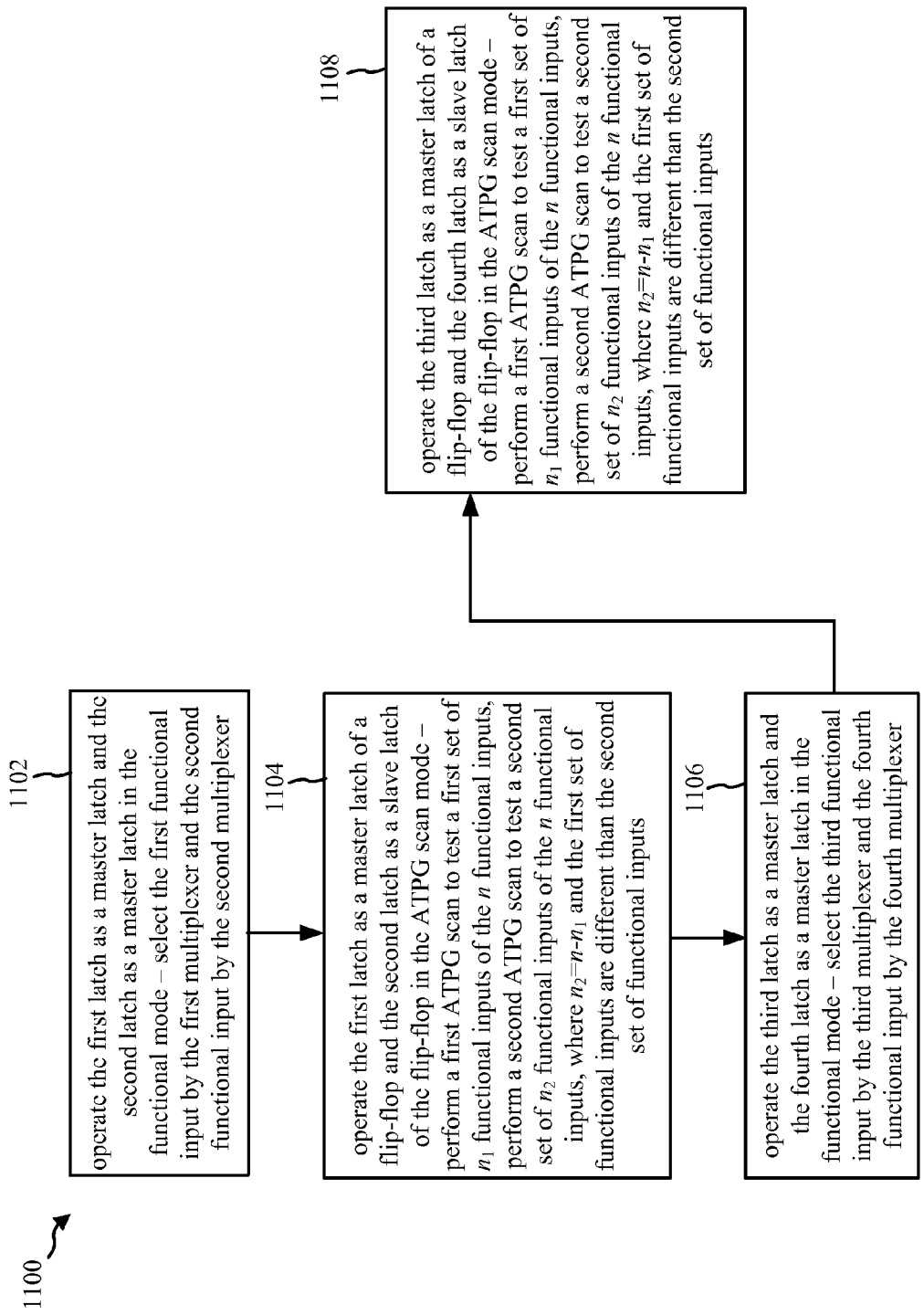
FIG. 11 is a flow chart of a first method of utilizing an apparatus in a functional mode and an ATPG scan mode.

FIG. 11 is a flow chart 1100 of a method of an apparatus in a functional mode and an ATPG scan mode. The apparatus may be an interface circuit within a digital circuit. In one configuration, the apparatus may be a memory interface circuit within a memory. The apparatus includes a set of latches including a first latch 504 and a second latch 508. In step 1102, the apparatus operates the first latch 504 as a master latch and the second latch 508 as a master latch in the functional mode. In step 1104, the apparatus operates the first latch 504 as a master latch of a flip-flop 510 and the second latch 508 as a slave latch of the flip-flop 510 in the ATPG scan mode. The apparatus may include a plurality of latches. The plurality of latches include at least the first latch 504 and the second latch 508. An output of each of the plurality of latches may be coupled to a digital circuit 550. The apparatus may include a plurality of functional inputs, and each of the functional inputs may be input to the digital circuit 550. As discussed supra, the digital circuit 550 may be a memory, and the functional inputs may be input pins of the memory. The apparatus may include n functional inputs. In step 1104, the apparatus may operate the first latch 504 as a master latch of a flip-flop 510 and the second latch 508 as a slave latch of the flip-flop 510 in the ATPG scan mode by performing a first ATPG scan of a first set of $n_1$ functional inputs of the n functional inputs, and performing a second ATPG scan of a second set of $n_2$ functional inputs of the n functional inputs, where $n_2=n-n_1$ and the first set of functional inputs are different than the second set of functional inputs. The values $n_1$ and $n_2$ may each be approximately equal to n/2, where n is an even integer greater than zero.

The apparatus may further include a first multiplexer 502 and a second multiplexer 506. The first latch 504 may be coupled to an output of the first multiplexer 502. The second multiplexer 506 may be coupled to an output of the first latch 504. The second latch 508 may be coupled to an output of the second multiplexer 506. The first multiplexer 502 may receive a first functional input $F_{in1}$, a second functional input $F_{in2}$, and a scan input $S_{in}$. The second multiplexer 506 may receive the second functional input $F_{in2}$ and the output of the first latch 504. In step 1102, the apparatus may operate the first latch as a master latch and the second latch as a master latch in the functional mode by selecting the first functional input $F_{in1}$ by the first multiplexer 502 and the second functional input $F_{in2}$ by the second multiplexer 506.

The set of latches may further include a third latch 514 and a fourth latch 518. In step 1106, the apparatus operates the third latch 514 as a master latch and the fourth latch 518 as a master latch in the functional mode. In step 1108, the apparatus operates the third latch 514 as a master latch of a flip-flop 520 and the fourth latch 518 as a slave latch of the flip-flop 520 in the ATPG scan mode. The apparatus may further include a third multiplexer 512 and a fourth multiplexer 516. The third multiplexer 512 may be coupled to an output of the second latch 508. The third latch 514 may be coupled to an output of the third multiplexer 512. The fourth multiplexer 516 may be coupled to an output of the third latch 514. The fourth latch 518 may be coupled to an output of the fourth multiplexer 516. The third multiplexer 512 may receive a third functional input $F_{in3}$, a fourth functional input $F_{in4}$, and the output of the second latch. The fourth multiplexer 516 may receive the fourth functional input $F_{in4}$ and the output of the third latch. In step 1106, the apparatus operates the third latch 514 as a master latch and the fourth latch 518 as a master latch in the functional mode by selecting the third functional input $F_{in3}$ by the third multiplexer 512 and the fourth functional input $F_{in4}$ by the fourth multiplexer 516. In step 1108, the apparatus may operate the third latch 514 as a master latch of a flip-flop 520 and the fourth latch 518 as a slave latch of the flip-flop 520 in the ATPG scan mode by performing a first ATPG scan of a first set of $n_1$ functional inputs of the n functional inputs, and performing a second ATPG scan of a second set of $n_2$ functional inputs of the n functional inputs, where $n_2=n-n_1$ and the first set of functional inputs are different than the second set of functional inputs. The values $n_1$ and $n_2$ may each be approximately equal to n/2, where n is an even integer greater than zero.

Figure 12:
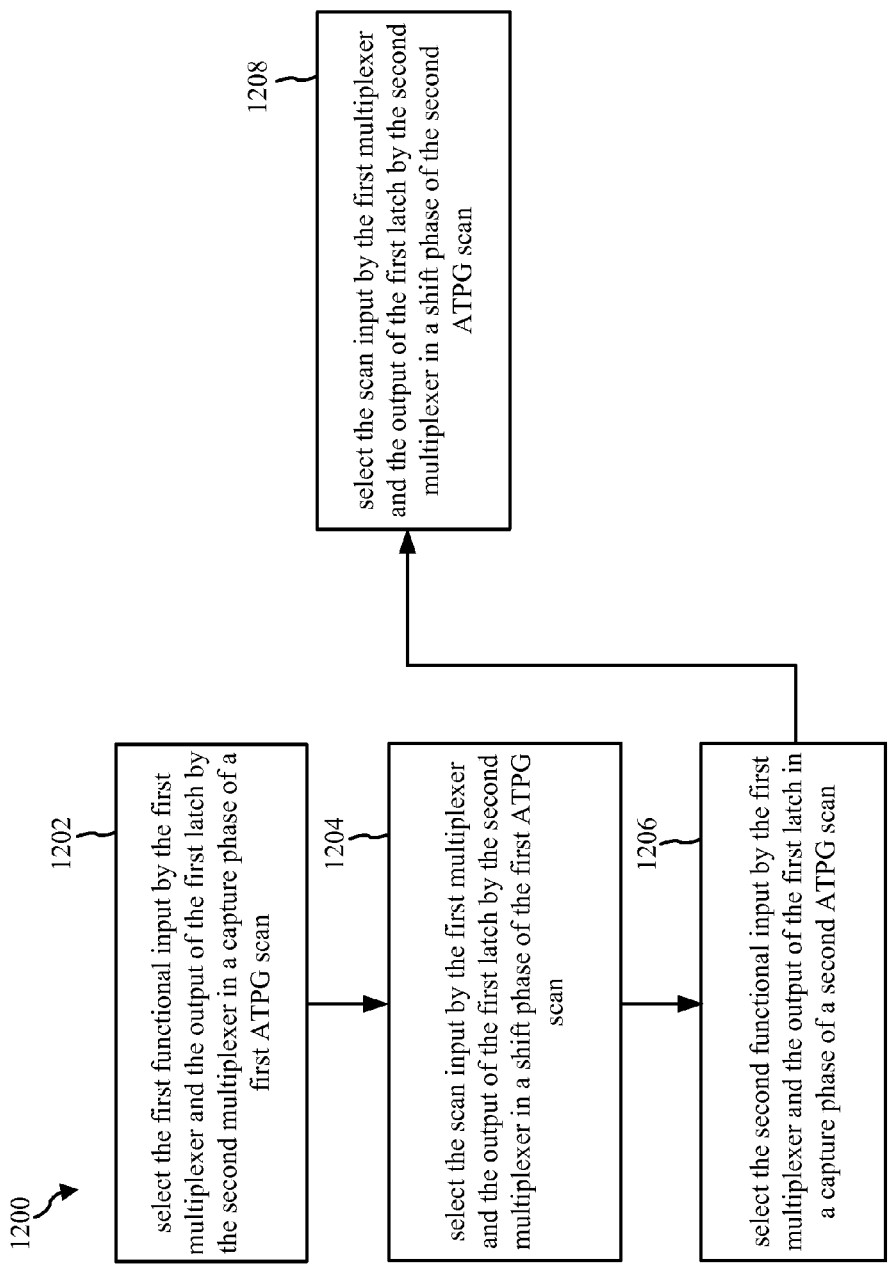
FIG. 12 is a flow chart of a second method of utilizing an apparatus in a functional mode and an ATPG scan mode.

FIG. 12 is a flow chart 1200 of a second method of an apparatus in a functional mode and an ATPG scan mode. The apparatus may include a first multiplexer 502 and a second multiplexer 506. The first latch 504 may be coupled to an output of the first multiplexer 502. The second multiplexer 506 may be coupled to an output of the first latch 504. The second latch 508 may be coupled to an output of the second multiplexer 506. The first multiplexer 502 may receive a first functional input $F_{in1}$, a second functional input $F_{in2}$, and a scan input. The second multiplexer 506 may receive the second functional input $F_{in2}$ and the output of the first latch. In step 1104, the apparatus may operate the first latch 504 as a master latch of a flip-flop 510 and the second latch 508 as a slave latch of the flip-flop 510 in the ATPG scan mode by performing steps 1202-1208. In step 1202, the apparatus selects the first functional input $F_{in1}$ by the first multiplexer 502 and the output of the first latch by the second multiplexer 506 in a capture phase of a first ATPG scan. In step 1204, the apparatus selects the scan input $S_{in}$ by the first multiplexer 502 and the output of the first latch 504 by the second multiplexer 506 in a shift phase of the first ATPG scan. In step 1206, the apparatus selects the second functional input $F_{in2}$ by the first multiplexer 502 and the output of the first latch 504 in a capture phase of a second ATPG scan. In step 1208, the apparatus selects the scan input $S_{in}$ by the first multiplexer 502 and the output of the first latch 504 by the second multiplexer 506 in a shift phase of the second ATPG scan.

Figure 13:
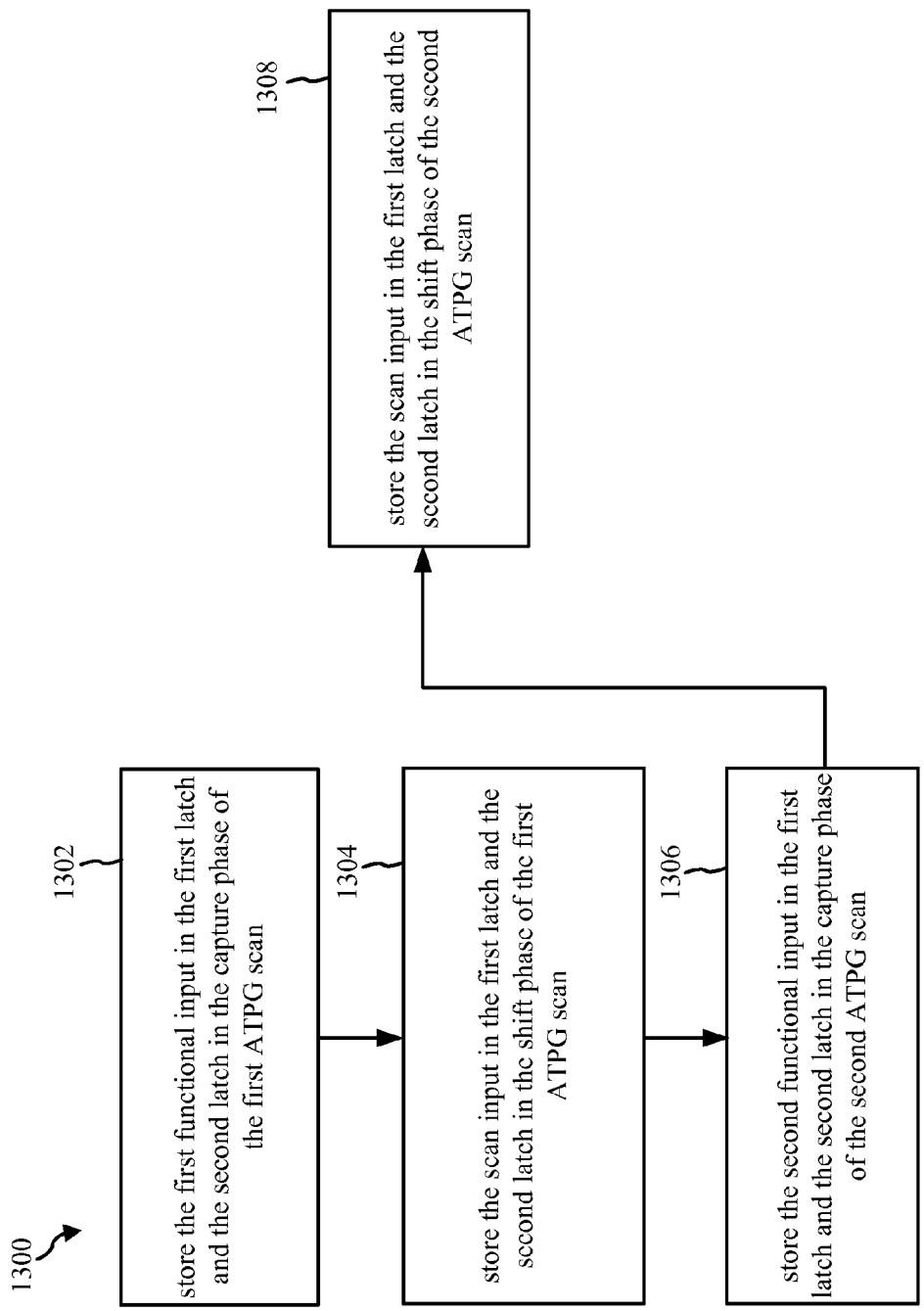
FIG. 13 is a flow chart of a third method of utilizing an apparatus in a functional mode and an ATPG scan mode.

FIG. 13 is a flow chart 1300 of a third method of an apparatus in a functional mode and an ATPG scan mode. In step 1104, the apparatus may operate the first latch 504 as a master latch of a flip-flop 510 and the second latch 508 as a slave latch of the flip-flop 510 in the ATPG scan mode by performing the steps 1302-1308. In step 1302, the apparatus stores the first functional input $F_{in1}$ in the first latch 504 and the second latch 508 in the capture phase of the first ATPG scan. In step 1304, the apparatus stores the scan input $S_{in}$ in the first latch 504 and the second latch 508 in the shift phase of the first ATPG scan. In step 1306, the apparatus stores the second functional input $F_{in2}$ in the first latch 504 and the second latch 508 in the capture phase of the second ATPG scan. In step 1308, the apparatus stores the scan input $S_{in}$ in the first latch 504 and the second latch 508 in the shift phase of the second ATPG scan.

Figure 14:
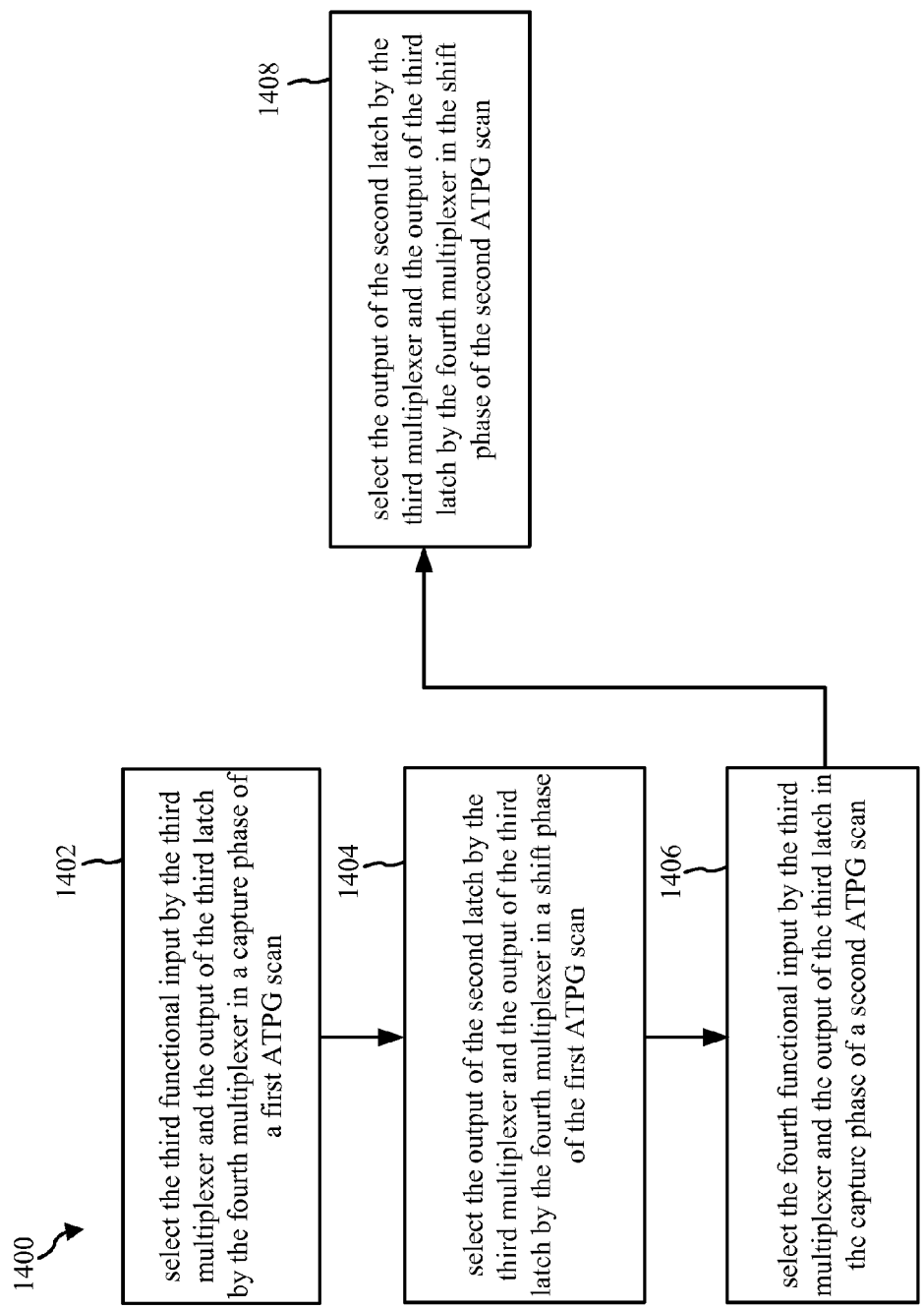
FIG. 14 is a flow chart of a fourth method of utilizing an apparatus in a functional mode and an ATPG scan mode.

FIG. 14 is a flow chart 1400 of a fourth method of an apparatus in a functional mode and an ATPG scan mode. The apparatus may include a third multiplexer 512 and a fourth multiplexer 516. The third multiplexer 512 may be coupled to an output of the second latch 508. The third latch 514 may be coupled to an output of the third multiplexer 512. The fourth multiplexer 516 may be coupled to an output of the third latch 514. A fourth latch 518 may be coupled to an output of the fourth multiplexer 516. The third multiplexer 512 may receive a third functional input $F_{in3}$, a fourth functional input $F_{in4}$, and the output of the second latch 508. The fourth multiplexer 516 may receive the fourth functional input $F_{in4}$ and the output of the third latch 514. In step 1108, the apparatus may operate the third latch 514 as a master latch of a flip-flop 520 and the fourth latch 518 as a slave latch of the flip-flop 520 in the ATPG scan mode by performing the steps 1402-1408. In step 1402, the apparatus selects the third functional input $F_{in3}$ by the third multiplexer 512 and the output of the third latch 514 by the fourth multiplexer 516 in a capture phase of a first ATPG scan. In step 1404, the apparatus selects the output of the second latch 508 by the third multiplexer 512 and the output of the third latch 514 by the fourth multiplexer 516 in a shift phase of the first ATPG scan. In step 1406, the apparatus selects the fourth functional input $F_{in4}$ by the third multiplexer 512 and the output of the third latch 514 in the capture phase of a second ATPG scan. In step 1408, the apparatus selects the output of the second latch 508 by the third multiplexer 512 and the output of the third latch 514 by the fourth multiplexer 516 in the shift phase of the second ATPG scan.

Figure 15:
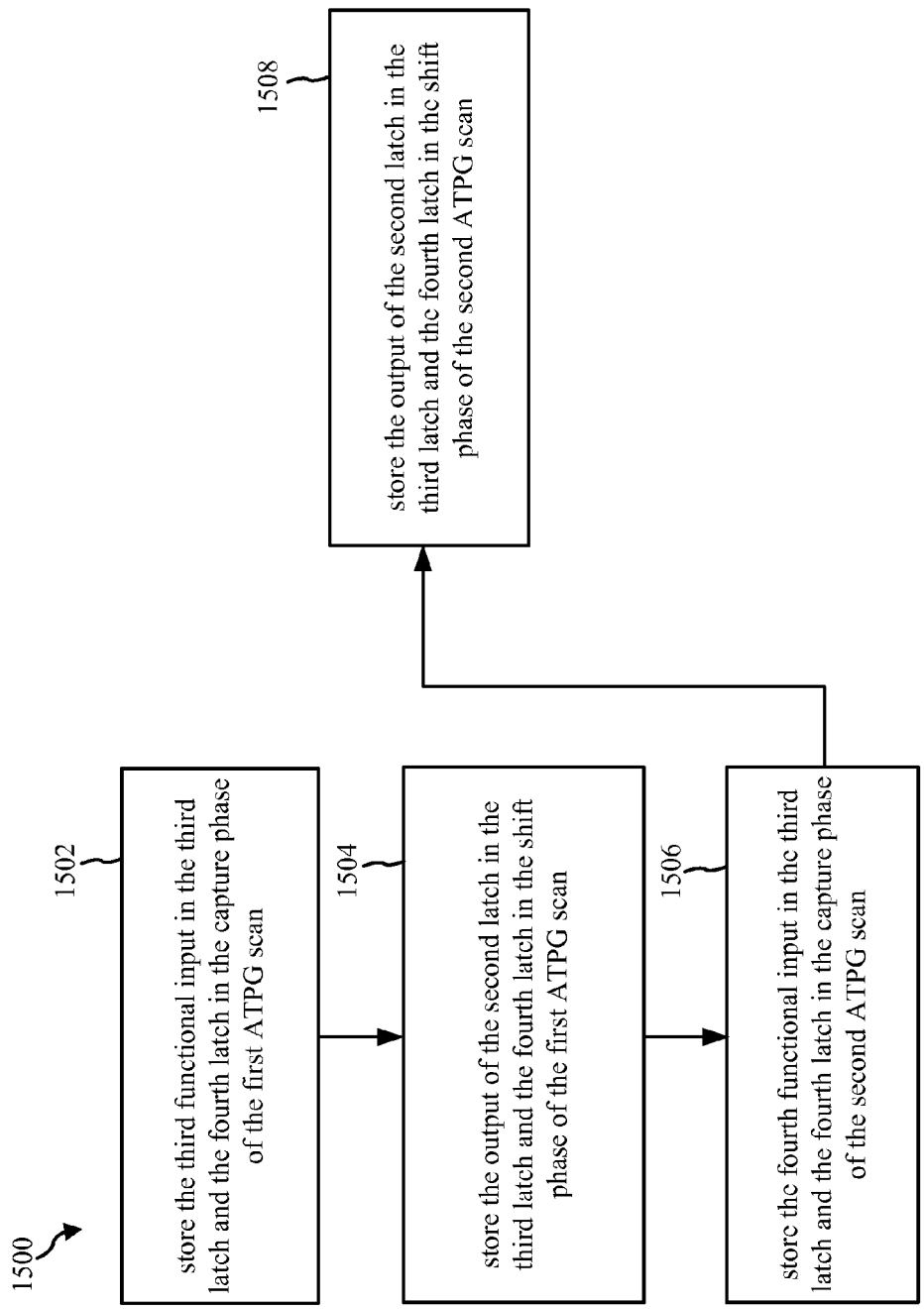
FIG. 15 is a flow chart of a fifth method of utilizing an apparatus in a functional mode and an ATPG scan mode.

FIG. 15 is a flow chart 1500 of a fifth method of an apparatus in a functional mode and an ATPG scan mode. In step 1108, the apparatus may operate the third latch 514 as a master latch of a flip-flop 520 and the fourth latch 518 as a slave latch of the flip-flop 520 in the ATPG scan mode by performing the steps 1502-1508. In step 1502, the apparatus stores the third functional input $F_{in3}$ in the third latch 514 and the fourth latch 518 in the capture phase of the first ATPG scan. In step 1504, the apparatus stores the output of the second latch 508 in the third latch 514 and the fourth latch 518 in the shift phase of the first ATPG scan. In step 1506, the apparatus stores the fourth functional input $F_{in4}$ in the third latch 514 and the fourth latch 518 in the capture phase of the second ATPG scan. In step 1508, the apparatus stores the output of the second latch 508 in the third latch 514 and the fourth latch 518 in the shift phase of the second ATPG scan.

In one configuration, the apparatus operates at different times in one of a functional mode or an ATPG scan mode. The apparatus operates in a functional mode during normal operation. The apparatus operates in an ATPG scan mode when an ATPG scan is being performed. The apparatus includes a set of latches including a first latch and a second latch. The apparatus includes a means for operating the first latch as a master latch and the second latch as a master latch in the functional mode. For example, referring to FIG. 6, the means for operating the first latch as a master latch and the second latch as a master latch in the functional mode includes the latches 504, 508; the multiplexers 502, 506; and the multiplexers 502, 506 receiving and selecting the inputs in bold. The apparatus further includes a means for operating the first latch as a master latch of a flip-flop and the second latch as a slave latch of the flip-flop in the ATPG scan mode. For example, referring to FIGS. 7, 8, 9, and 10, the means for operating the first latch as a master latch of a flip-flop and the second latch as a slave latch of the flip-flop in the ATPG scan mode includes the latches 504, 508; the multiplexers 502, 506; and the multiplexers 502, 506 receiving and selecting the inputs in bold. In one configuration, the apparatus includes n functional inputs, and the means for operating the first latch as a master latch of a flip-flop and the second latch as a slave latch of the flip-flop in the ATPG scan mode is configured to perform a first ATPG scan of a first set of $n_1$ functional inputs of the n functional inputs, and to perform a second ATPG scan of a second set of $n_2$ functional inputs of the n functional inputs, where $n_2=n-n_1$ and the first set of functional inputs are different than the second set of functional inputs. In one configuration, the apparatus further includes a first multiplexer and a second multiplexer. The first latch is coupled to an output of the first multiplexer. The second multiplexer is coupled to an output of the first latch. The second latch is coupled to an output of the second multiplexer. The first multiplexer receives a first functional input, a second functional input, and a scan input. The second multiplexer receives the second functional input and the output of the first latch. The means for operating the first latch as a master latch and the second latch as a master latch in the functional mode may be configured to select the first functional input by the first multiplexer and the second functional input by the second multiplexer. For example, referring to FIG. 6, the multiplexers 502, 506 receive and select the inputs in bold.

In one configuration, the apparatus includes a first multiplexer and a second multiplexer. The first latch is coupled to an output of the first multiplexer. The second multiplexer is coupled to an output of the first latch. The second latch is coupled to an output of the second multiplexer. The first multiplexer receives a first functional input, a second functional input, and a scan input. The second multiplexer receives the second functional input and the output of the first latch. The means for operating the first latch as a master latch of a flip-flop and the second latch as a slave latch of the flip-flop in the ATPG scan mode may be configured to select the first functional input by the first multiplexer and the output of the first latch by the second multiplexer in a capture phase of a first ATPG scan (e.g., referring to FIG. 7, the multiplexers 502, 506 receive and select the inputs in bold), to select the scan input by the first multiplexer and the output of the first latch by the second multiplexer in a shift phase of the first ATPG scan (e.g., referring to FIG. 8, the multiplexers 502, 506 receive and select the inputs in bold), to select the second functional input by the first multiplexer and the output of the first latch in a capture phase of a second ATPG scan (e.g., referring to FIG. 9, the multiplexers 502, 506 receive and select the inputs in bold), and to select the scan input by the first multiplexer and the output of the first latch by the second multiplexer in a shift phase of the second ATPG scan (e.g., referring to FIG. 10, the multiplexers 502, 506 receive and select the inputs in bold). In one configuration, the means for operating the first latch as a master latch of a flip-flop and the second latch as a slave latch of the flip-flop in the ATPG scan mode is configured to store the first functional input in the first latch and the second latch in the capture phase of the first ATPG scan (e.g., referring to FIG. 7, the latches 504, 508 store the inputs in bold), to store the scan input in the first latch and the second latch in the shift phase of the first ATPG scan (e.g., referring to FIG. 8, the latches 504, 508 store the inputs in bold), to store the second functional input in the first latch and the second latch in the capture phase of the second ATPG scan (e.g., referring to FIG. 9, the latches 504, 508 store the inputs in bold), and to store the scan input in the first latch and the second latch in the shift phase of the second ATPG scan (e.g., referring to FIG. 10, the latches 504, 508 store the inputs in bold).

In one configuration, the set of latches further includes a third latch and a fourth latch, and the apparatus further includes means for operating the third latch as a master latch and the fourth latch as a master latch in the functional mode, and means for operating the third latch as a master latch of a flip-flop and the fourth latch as a slave latch of the flip-flop in the ATPG scan mode. In one configuration, the apparatus further includes a third multiplexer and a fourth multiplexer. The third multiplexer is coupled to an output of the second latch. The third latch is coupled to an output of the third multiplexer. The fourth multiplexer is coupled to an output of the third latch. The fourth latch is coupled to an output of the fourth multiplexer. The third multiplexer receives a third functional input, a fourth functional input, and the output of the second latch. The fourth multiplexer receives the fourth functional input and the output of the third latch. For example, referring to FIG. 6, the means for operating the third latch as a master latch and the fourth latch as a master latch in the functional mode includes the latches 514, 518; the multiplexers 512, 516; and the multiplexers 512, 516 receiving and selecting the inputs in bold. The means for operating the third latch as a master latch and the fourth latch as a master latch in the functional mode may be configured to select the third functional input by the third multiplexer and the fourth functional input by the fourth multiplexer. For example, referring to FIG. 6, the multiplexers 512, 516 receive and select the inputs in bold.

In one configuration, the apparatus further includes a third multiplexer and a fourth multiplexer. The third multiplexer is coupled to an output of the second latch. The third latch is coupled to an output of the third multiplexer. The fourth multiplexer is coupled to an output of the third latch. The fourth latch is coupled to an output of the fourth multiplexer. The third multiplexer receives a third functional input, a fourth functional input, and the output of the second latch. The fourth multiplexer receives the fourth functional input and the output of the third latch. For example, referring to FIGS. 7, 8, 9, and 10, the means for operating the third latch as a master latch of a flip-flop and the fourth latch as a slave latch of the flip-flop in the ATPG scan mode includes the latches 514, 518; the multiplexers 512, 516; and the multiplexers 512, 516 receiving and selecting the inputs in bold. The means for operating the third latch as a master latch of a flip-flop and the fourth latch as a slave latch of the flip-flop in the ATPG scan mode may be configured to select the third functional input by the third multiplexer and the output of the third latch by the fourth multiplexer in a capture phase of a first ATPG scan (e.g., referring to FIG. 7, the multiplexers 512, 516 receive and select the inputs in bold), to select the output of the second latch by the third multiplexer and the output of the third latch by the fourth multiplexer in a shift phase of the first ATPG scan (e.g., referring to FIG. 8, the multiplexers 512, 516 receive and select the inputs in bold), to select the fourth functional input by the third multiplexer and the output of the third latch in the capture phase of a second ATPG scan (e.g., referring to FIG. 9, the multiplexers 512, 516 receive and select the inputs in bold), and to select the output of the second latch by the third multiplexer and the output of the third latch by the fourth multiplexer in the shift phase of the second ATPG scan (e.g., referring to FIG. 10, the multiplexers 512, 516 receive and select the inputs in bold). In one configuration, the means for operating the third latch as a master latch of a flip-flop and the fourth latch as a slave latch of the flip-flop in the ATPG scan mode is configured to store the third functional input in the third latch and the fourth latch in the capture phase of the first ATPG scan (e.g., referring to FIG. 7, the latches 514, 518 store the inputs in bold), to store the output of the second latch in the third latch and the fourth latch in the shift phase of the first ATPG scan (e.g., referring to FIG. 8, the latches 514, 518 store the inputs in bold), to store the fourth functional input in the third latch and the fourth latch in the capture phase of the second ATPG scan (e.g., referring to FIG. 9, the latches 514, 518 store the inputs in bold), and to store the output of the second latch in the third latch and the fourth latch in the shift phase of the second ATPG scan (e.g., referring to FIG. 10, the latches 514, 518 store the inputs in bold).

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus for performing automatic test pattern generation (ATPG) scans, comprising:
  a first multiplexer having a plurality of first multiplexer inputs and a first multiplexer output, the first multiplexer inputs being coupled to a first functional input, a second functional input, and a shift input, the first multiplexer being configured to select one of the first functional input, the second functional input, or the shift input to output at the first multiplexer output;

a first latch having a first latch input and a first latch output, the first latch input being coupled to the first multiplexer output;

a second multiplexer having a plurality of second multiplexer inputs and a second multiplexer output, the second multiplexer inputs being coupled to the second functional input and the first latch output, the second multiplexer being configured to select one of the second functional input or the first latch output to output at the second multiplexer output; and a second latch having a second latch input, the second latch input being coupled to the second multiplexer output, wherein the first multiplexer is configured to select the first functional input during a capture phase of an ATPG scan, and the second multiplexer is configured to select the first latch output during the capture phase of the ATPG scan.

2. The apparatus of claim 1, wherein the second latch has a second latch output, the apparatus comprises a plurality of latches, the plurality of latches comprise at least the first latch and the second latch, the output of each of the plurality of latches is coupled to a digital circuit, the apparatus includes a plurality of functional inputs, and the apparatus is configured to provide each of the functional inputs to the digital circuit.

3. The apparatus of claim 2, wherein the digital circuit is a memory, and the functional inputs are input pins of the memory.

4. The apparatus of claim 1, wherein the apparatus includes n functional inputs, the n functional inputs include at least the first functional input and the second functional input, and the first latch is configured to operate as a master latch of a flip-flop and the second latch is configured to operate as a slave latch of the flip-flop in an ATPG scan mode when performing a first ATPG scan of a first set of $n_1$ functional inputs of the n functional inputs, the $n_1$ functional inputs including at least the first functional input, and when performing a second ATPG scan of a second set of $n_2$ functional inputs of the n functional inputs, where $n_2=n-n_1$, the first set of functional inputs are different than the second set of functional inputs, and the $n_2$ functional inputs include at least the second functional input.

5. The apparatus of claim 4, wherein $n_1$ and $n_2$ are each approximately equal to n/2.

6. The apparatus of claim 1, wherein the first latch is configured to operate as a master latch of a flip-flop and the second latch is configured to operate as a slave latch of the flip-flop during the ATPG scan.

7. The apparatus of claim 6, wherein:
the first latch and the second latch are configured to store the first functional input during the capture phase of the ATPG scan;
the first multiplexer is configured to select the shift input during a shift phase of the ATPG scan, and the second multiplexer is configured to select the first latch output during the shift phase of the ATPG scan; and
the first latch and the second latch are configured to store the shift input during the shift phase of the ATPG scan.

8. The apparatus of claim 7, wherein:
the first multiplexer is configured to select the second functional input during a capture phase of a second ATPG scan, and the second multiplexer is configured to select the first latch output during the capture phase of the second ATPG scan;
the first latch and the second latch are configured to store the second functional input during the capture phase of the second ATPG scan;

the first multiplexer is configured to select the shift input during a shift phase of the second ATPG scan, and the second multiplexer is configured to select the first latch output during the shift phase of the second ATPG scan; and
the first latch and the second latch are configured to store the shift input during the shift phase of the second ATPG scan.

9. The apparatus of claim 1, wherein the second latch has a second latch output and the apparatus further comprises:
a third multiplexer having a plurality of third multiplexer inputs and a third multiplexer output, the third multiplexer inputs being coupled to a third functional input, a fourth functional input, and the second latch output, the third multiplexer being configured to select one of the third functional input, the fourth functional input, or the second latch output to output at the third multiplexer output;
a third latch having a third latch input and a third latch output, the third latch input being coupled to the third multiplexer output;
a fourth multiplexer having a plurality of fourth multiplexer inputs and a fourth multiplexer output, the fourth multiplexer inputs being coupled to the fourth functional input and the third latch output, the fourth multiplexer being configured to select one of the fourth functional input or the third latch output to output at the fourth multiplexer output; and
a fourth latch having a fourth latch input, the fourth latch input being coupled to the fourth multiplexer output.

10. The apparatus of claim 9, wherein the first latch is configured to operate as a master latch of a flip-flop and the second latch is configured to operate as a slave latch of the flip-flop during the ATPG scan, and the third latch is configured to operate as a master latch of a second flip-flop and the fourth latch is configured to operate as a slave latch of the second flip-flop during the ATPG scan.

11. An apparatus for performing automatic test pattern generation (ATPG) scans, comprising:
a first multiplexer having a plurality of first multiplexer inputs and a first multiplexer output, the first multiplexer inputs being coupled to a first functional input, a second functional input, and a shift input, the first multiplexer being configured to select one of the first functional input, the second functional input, or the shift input to output at the first multiplexer output;
a first latch having a first latch input and a first latch output, the first latch input being coupled to the first multiplexer output;
a second multiplexer having a plurality of second multiplexer inputs and a second multiplexer output, the second multiplexer inputs being coupled to the second functional input and the first latch output, the second multiplexer being configured to select one of the second functional input or the first latch output to output at the second multiplexer output; and
a second latch having a second latch input, the second latch input being coupled to the second multiplexer output,
wherein the second latch has a second latch output and the apparatus further comprises:
a third multiplexer having a plurality of third multiplexer inputs and a third multiplexer output, the third multiplexer inputs being coupled to a third functional input, a fourth functional input, and the second latch output, the third multiplexer being configured to select one of the third functional input, the fourth functional input, or the second latch output to output at the third multiplexer output;

a third latch having a third latch input and a third latch output, the third latch input being coupled to the third multiplexer output;

a fourth multiplexer having a plurality of fourth multiplexer inputs and a fourth multiplexer output, the fourth multiplexer inputs being coupled to the fourth functional input and the third latch output, the fourth multiplexer being configured to select one of the fourth functional input or the third latch output to output at the fourth multiplexer output; and a fourth latch having a fourth latch input, the fourth latch input being coupled to the fourth multiplexer output, wherein the first latch is configured to operate as a master latch of a flip-flop and the second latch is configured to operate as a slave latch of the flip-flop during an ATPG scan, and the third latch is configured to operate as a master latch of a second flip-flop and the fourth latch is configured to operate as a slave latch of the second flip-flop during the ATPG scan, wherein:

the first multiplexer is configured to select the first functional input during a capture phase of the ATPG scan, and the second multiplexer is configured to select the first latch output during the capture phase of the ATPG scan;

the third multiplexer is configured to select the third functional input during the capture phase of the ATPG scan, and the fourth multiplexer is configured to select the third latch output during the capture phase of the ATPG scan;

the first latch and the second latch are configured to store the first functional input during the capture phase of the ATPG scan; and the third latch and the fourth latch are configured to store the third functional input during the capture phase of the ATPG scan.

12. The apparatus of claim 11, wherein:

the first multiplexer is configured to select the shift input during a shift phase of the ATPG scan, and the second multiplexer is configured to select the first latch output during the shift phase of the ATPG scan;

the third multiplexer is configured to select the second latch output during the shift phase of the ATPG scan, and the fourth multiplexer is configured to select the third latch output during the shift phase of the ATPG scan;

the first latch and the second latch are configured to store the shift input during the shift phase of the ATPG scan; and the third latch and the fourth latch are configured to store the second latch output during the shift phase of the ATPG scan.

13. The apparatus of claim 12, wherein:

the first multiplexer is configured to select the second functional input during a capture phase of a second ATPG scan, and the second multiplexer is configured to select the first latch output during the capture phase of the second ATPG scan;

the third multiplexer is configured to select the fourth functional input during the capture phase of the second ATPG scan, and the fourth multiplexer is configured to select the third latch output during the capture phase of the second ATPG scan;

the first latch and the second latch are configured to store the second functional input during the capture phase of the second ATPG scan; and the third latch and the fourth latch are configured to store the fourth functional input during the capture phase of the second ATPG scan.

14. The apparatus of claim 13, wherein:

the first multiplexer is configured to select the shift input during a shift phase of the second ATPG scan, and the second multiplexer is configured to select the first latch output during the shift phase of the second ATPG scan;

the third multiplexer is configured to select the second latch output during the shift phase of the second ATPG scan, and the fourth multiplexer is configured to select the third latch output during the shift phase of the second ATPG scan;

the first latch and the second latch are configured to store the shift input during the shift phase of the second ATPG scan; and the third latch and the fourth latch are configured to store the second latch output during the shift phase of the second ATPG scan.

\* \* \* \* \*